(12) United States Patent
Berkhout et al.

(10) Patent No.: US 10,566,939 B2
(45) Date of Patent: Feb. 18, 2020

(54) CIRCUIT FOR GENERATING A PLURALITY OF REFERENCE VOLTAGES FOR CONTROLLING FEEDBACK WITHIN THE CIRCUIT

(71) Applicant: NXP B.V., Eindhoven (NL)

(72) Inventors: Marco Berkhout, Tiel (NL); Paulus Petrus Franciscus Maria Bruin, Nijmegen (NL)

(73) Assignee: NXP B.V., Eindhoven (NL)

( * ) Notice: Subject to any disclaimer, the term of this patent is extended or adjusted under 35 U.S.C. 154(b) by 4 days.

(21) Appl. No.: 15/982,173

(22) Filed: May 17, 2018

(65) Prior Publication Data

US 2019/0007008 A1 Jan. 3, 2019

(30) Foreign Application Priority Data

Jun. 30, 2017 (EP) .................................... 17179103

(51) Int. Cl.
*H03F 3/217* (2006.01)
*H03F 3/185* (2006.01)
(Continued)

(52) U.S. Cl.
CPC ........... *H03F 3/2173* (2013.01); *H03F 3/185* (2013.01); *H03F 3/2175* (2013.01);
(Continued)

(58) Field of Classification Search
CPC ...... H03F 3/2173; H03F 3/185; H03F 3/2175; H03F 2200/03; H03F 2200/351;
(Continued)

(56) References Cited

U.S. PATENT DOCUMENTS 7,323,919 B2 * 1/2008 Yang ...................... H03F 3/217
327/172
7,768,347 B2 8/2010 De Cremoux
(Continued)

FOREIGN PATENT DOCUMENTS

WO WO-2008/110987 A2 9/2008
WO WO-2008/110987 A3 9/2008

OTHER PUBLICATIONS

Berkhout, Marco et al; "A 4Ω 2.65W Class-D Audio Amplifier With Embedded DC-DC Boost Converter, Current Sensing ADC and DSP for Adaptive Speaker Protection"; IEEE Journal of Solid State Circuits, vol. 48, No. 12; pp. 2952-2961 (Dec. 2013).
(Continued)

*Primary Examiner* — Khanh V Nguyen

(57) ABSTRACT

A circuit comprising: an input terminal configured to receive an input-signal; an output terminal configured to provide an output-signal; a reference circuit comprising: a first output terminal configured to provide a first-reference-signal; a second output terminal configured to provide a second-reference-signal; and a third output terminal configured to provide a third-reference-signal. A comparator-block configured to compare a comparator-input-voltage-signal representative of signalling received at the input terminal with: (i) the first-reference-signal, (ii) the second-reference-signal and (iii) the third-reference-signal in order to generate a comparison-signal. A control-block configured to set the output-signal as one of at least two voltage levels based on the comparison-signal; and an input-control-circuit configured to apply a feedback-control-signal to the input-terminal based on the comparison-signal.

15 Claims, 24 Drawing Sheets

(51) Int. Cl.
*H03G 3/30* (2006.01)
*H03K 7/08* (2006.01)
*H03K 17/16* (2006.01)
*H04R 3/04* (2006.01)

(52) U.S. Cl.
CPC ............ *H03G 3/3005* (2013.01); *H03K 7/08* (2013.01); *H03K 17/162* (2013.01); *H04R 3/04* (2013.01); *H03F 2200/03* (2013.01); *H03F 2200/351* (2013.01); *H03F 2200/66* (2013.01)

(58) Field of Classification Search
CPC .... H03F 2200/66; H03F 3/217; H03F 3/2171; H04R 3/04; H03K 17/162; H03K 7/08; H03G 3/3005
USPC ........................................ 330/10, 207 A, 251
See application file for complete search history.

(56) References Cited

U.S. PATENT DOCUMENTS

| | | | |
|---|---|---|---|
| 7,816,982 B2* | 10/2010 | Wu | ........................ H03K 7/08 330/10 |
| 8,081,022 B2 | 12/2011 | Berkhout et al. | |
| 8,558,617 B2 | 10/2013 | Cerutti | |
| 9,577,579 B2* | 2/2017 | Du | ........................ H03G 3/348 |
| 2003/0058038 A1* | 3/2003 | Noro | .................... H03F 3/2171 330/10 |
| 2006/0202754 A1 | 9/2006 | Yamamura et al. | |
| 2012/0049930 A1 | 3/2012 | Han | |
| 2013/0127530 A1 | 5/2013 | Ni et al. | |
| 2017/0104462 A1 | 4/2017 | Frith et al. | |

OTHER PUBLICATIONS

Dooper, Lutsen et al; "A 3.4 W Digital-In Class-D Audio Amplifier in 0.14μm CMOS"; IEEE Journal Solid State Circuits, vol. 47, No. 7; pp. 1524-1534 (Jul. 2012).

\* cited by examiner

CIRCUIT FOR GENERATING A PLURALITY OF REFERENCE VOLTAGES FOR CONTROLLING FEEDBACK WITHIN THE CIRCUIT

CROSS-REFERENCE TO RELATED APPLICATIONS

This application claims the priority under 35 U.S.C. § 119 of European patent application no. 17179103.1, filed Jun. 30, 2017 the contents of which are incorporated by reference herein.

The present disclosure relates to a circuit for generating a plurality of reference voltages for controlling feedback within the circuit, and in particular, although not necessarily, to circuits comprising a pulse width modulator, such as a Class-D amplifier.

According to a first aspect of the present disclosure there is provided a circuit comprising:
an input terminal configured to receive an input-signal;
an output terminal configured to provide an output-signal;
a reference circuit comprising:
  a first output terminal configured to provide a first-reference-signal;
  a second output terminal configured to provide a second-reference-signal; and
  a third output terminal configured to provide a third-reference-signal,
  wherein:
    the first-reference-signal varies between a high-value and a low-value;
    the second-reference-signal is generated to demarcate signal levels below the low-value;
    the third-reference-signal is generated to demarcate signal levels above the high-value,
a comparator-block configured to compare a comparator-input-voltage-signal representative of signalling received at the input terminal with: (i) the first-reference-signal, (ii) the second-reference-signal and (iii) the third-reference-signal in order to generate a comparison-signal;
a control-block configured to set the output-signal as one of at least two voltage levels based on the comparison-signal; and
an input-control-circuit configured to apply a feedback-control-signal to the input-terminal based on the comparison-signal.

In one or more embodiments, the reference circuit may comprise a fourth output terminal configured to provide a fourth-reference-signal that varies between the high-value and the low-value, and the comparison signal may be generated based on a comparison between the comparator-input-voltage-signal and the fourth-reference-signal.

In one or more embodiments, the control-block may be configured to set the output-signal as one of at least three voltage levels based on the comparison-signal.

In one or more embodiments, the first-reference-signal may be periodic and comprise: a low-signal-portion with a bottom-level configured to demarcate signal levels below the low-value; a rising-signal-portion that rises from the bottom-level via a midpoint-level to a top-level; a high-signal-portion at the top-level, configured to demarcate signal levels above the high-value; a falling-signal-portion that falls from the top-level via the midpoint-level to the bottom-level; and wherein the each of the second-reference-signal, the third-reference-signal and the fourth-reference-signal may comprise different phase shifted representations of the first-reference-signal.

In one or more embodiments, the second-reference-signal may be phase shifted by one quarter of the period of the first-reference-signal; the third-reference-signal may be phase shifted by one half of the period; the fourth-reference-signal may be phase shifted by three quarters of the period.

In one or more embodiments, the first-reference-signal may be periodic and comprise: a rising-signal-portion that rises from a bottom-level via a midpoint-level to a top-level; a falling-signal-portion that falls from the top-level via the midpoint-level to the bottom-level; wherein: the fourth-reference signal may be an inverted, or a phase shifted, representation of the first-reference-signal; the second-reference-signal may be a low-signal-portion, representative of the low-value; and the third-reference-signal may be a high-signal-portion, representative of the high-value.

In one or more embodiments, the output-signal may be set: to a ground-voltage-level if the comparator-input-signal crosses a rising-signal-portion below the midpoint-level; to a middle-voltage-level, greater than the ground-voltage-level, if the comparator-input-voltage-signal crosses a falling-signal-portion below the midpoint-level; to a boost-voltage-level, greater than the middle-voltage-level, if the comparator-input-voltage-signal crosses a falling-signal-portion above the midpoint-level; and to the middle-voltage-level if the comparator-input-voltage-signal crosses a rising-signal-portion above the midpoint-level.

In one or more embodiments, the input-control-circuit may comprise a pulse-block configured to apply a pulse to the input-terminal if the comparator-input-voltage-signal is either greater than the high-value, or less than the low-value.

In one or more embodiments, when the comparator-input-voltage-signal is greater than the high-value, the pulse may be configured to subtract from the input-signal until the comparator-input-voltage-signal reaches the high-value.

In one or more embodiments, when the comparator-input-voltage-signal is less than the low-value, the pulse may be configured to add to the input-signal until the comparator-input-voltage-signal reaches the low-value.

In one or more embodiments, the circuit may further comprise an integrator coupled to the input-terminal and the output-terminal, the integrator may be configured to generate the comparator-input-voltage-signal by integrating a difference between the input-signal and the output-signal.

In one or more embodiments, wherein the integrator may comprise a reference-node coupled to a supply voltage that is half the middle-voltage-level.

In one or more embodiments, the circuit may further comprise: a second-input-terminal configured to receive a second-input-signal; and a second-output-terminal configured to provide a second-output-signal, wherein: the comparator-block may be configured to compare a second-comparator-input-voltage-signal representative of signalling received at the second-input-terminal with: (i) the first-reference-signal, (ii) the second-reference-signal, (iii) the third-reference-signal and optionally (iv) a fourth-reference-signal, in order to generate the comparison-signal; the control-block may be configured to set the second-output-signal as one of at least two voltage levels based on the comparison-signal; and the input-control-circuit may be configured to apply a second-feedback-control-signal to the second-input-terminal based on the comparison-signal.

In one or more embodiments, the input-control-circuit may comprise a common-current-pulse-block configured to apply a common-current-pulse to the input-terminal and the second-input-terminal if the comparator-input-voltage-signal is less than the low-value or if the second-comparator-input-voltage-signal is less than the low value.

In one or more embodiments, the input-control-circuit may comprise a single-ended-current-pulse-block configured to apply a single-ended-current-pulse to: the input-terminal, if the comparator-input-voltage-signal is greater than the high-value; or the second-feedback-input-terminal, if the second-comparator-input-voltage-signal is greater than the high-value.

In one or more embodiments, there may be provided a Class-D amplifier-circuit, an amplifier circuit, an electronic device or an integrated circuit comprising any circuit disclosed herein.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

One or more embodiments will now be described by way of example only with reference to the accompanying drawings in which:

The acquisition and reproduction of audio signals was one of the first applications of electronic circuits. Today, audio electronics are ubiquitous and can be found in television and hi-fi stereo sets, car audio systems and more recently in mobile or cellular phones along with many other portable applications. A majority of these electronics is in the form of integrated circuits.

Figure 1:
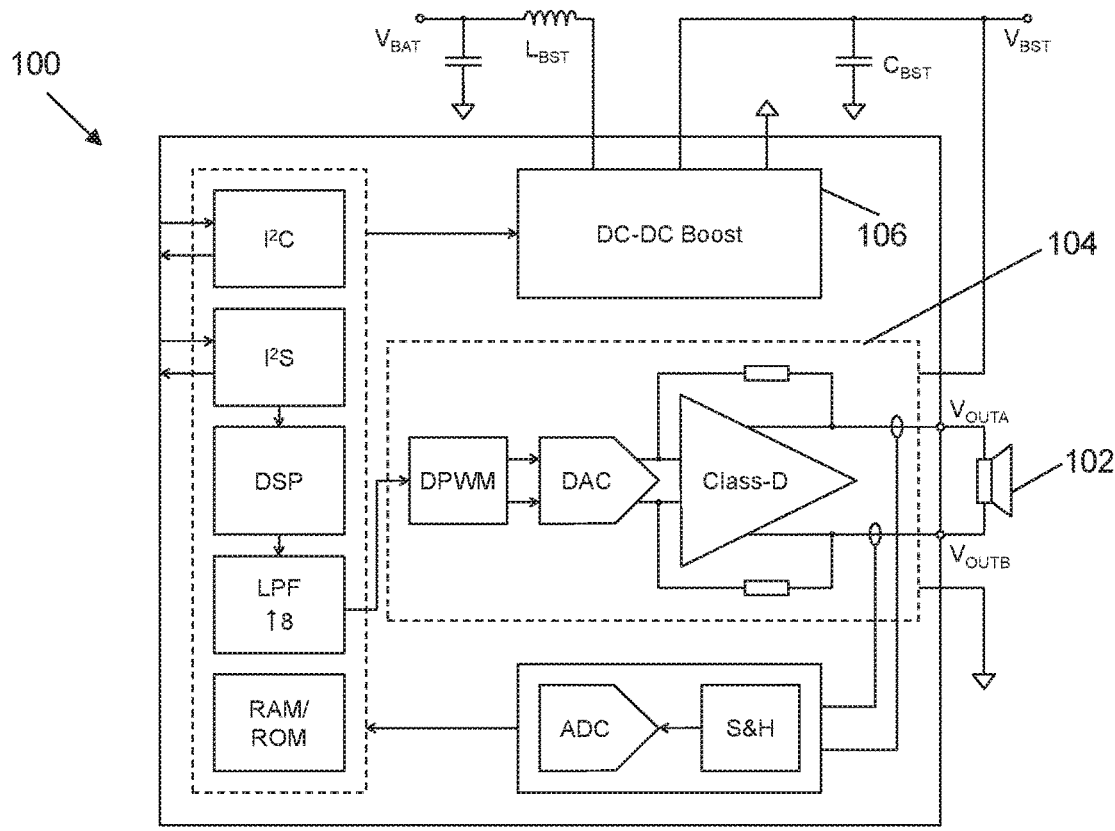
FIG. 1 shows an example of a block diagram of a smart speaker driver.

FIG. 1 illustrates a block diagram of a smart speaker driver 100 for use in mobile phones. The smart speaker driver 100 can maximize acoustic output while ensuring that a loud-speaker 102 is not damaged. This may be achieved by predicting a membrane excursion and estimating a voice-coil temperature by means of a speaker model. The membrane excursion is directly related to the sound pressure level (SPL). Differences between the speaker model and the real performance can be reduced by feedback of a real-time measurement of current entering the loud-speaker 102.

A component of the smart speaker driver 100 is a high efficiency class-D amplifier 104 that drives the loud-speaker 102. The class-D amplifier 104 is supplied by a DC-DC boost converter 106 in this example, which can provide high output power even at a low battery voltage. The DC-DC boost converter 106 is controlled from the digital domain and may only be enabled when high power is required at the output of the class-D amplifier 104. The combined efficiency of the DC-DC boost converter 106 and the class-D amplifier 104 can be optimized by performing a coarse envelope tracking of the audio signal.

The heart of the smart speaker driver is the high efficiency class-D amplifier 104 that drives the actual loudspeaker 102. The amplifier 104 is supplied by a DC-DC boost converter 106 that provides high output power even at low battery voltage. The DC-DC boost converter 106 is controlled from the digital domain and may only be enabled when high power is needed at the amplifier output. The combined efficiency of the DC-DC boost converter and amplifier can be optimized by doing a coarse envelope tracking of the audio signal.

Figure 2A:
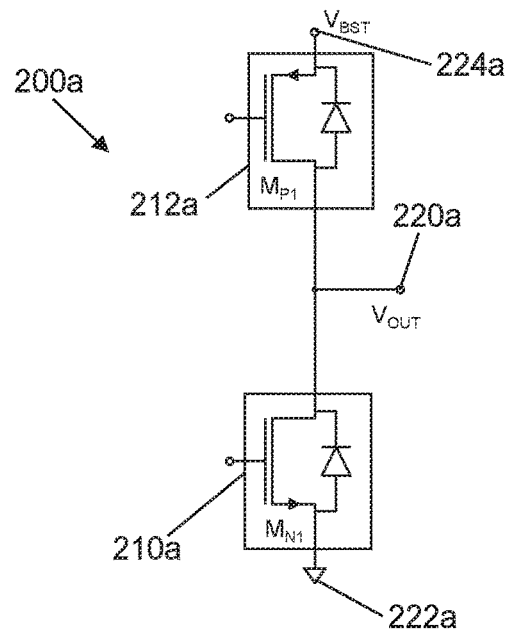
FIGS. 2a and 2b show two examples of class-D amplifier output stages.

FIG. 2a shows a simple example of a class-D amplifier 200a. The class-D amplifier has two large power MOSFETs MN1 210a and MP1 212a that connect an output node VOUT 220a to either ground 222a or to a supply rail VBST 224a. Since the output node VOUT 220a alternates between two levels this configuration can be referred to as a 2-level class-D amplifier. Pulse-Width Modulation (PWM) can be used to drive the output node VOUT 220a and the output signal can be recovered with a lossless LC-lowpass filter (not shown) between the class-D output stage and a loudspeaker load (not shown). Furthermore, two 2-level class-D output stages can be used in a bridge-tied-load (BTL) configuration. In the BTL configuration a load is connected between two amplifiers to double the available voltage swing with the same supply voltage. A BTL configuration therefore has two output terminals, which in the disclosure below will generally be labelled as VOUTA and VOUTB. A BTL configuration allows for filterless connection of a loudspeaker load between VOUTA and VOUTB. The filterless BTL configuration may be preferred in some mobile applications.

The 2-level Class-D amplifier 200a is supplied by a DC-DC boost converter or 'booster' (not shown) coupled to the supply rail VBST 224a. The booster allows a supply voltage VBST of the 2-level Class-D amplifier 200a to be higher than a battery voltage VBAT, that can be used to supply voltage to the booster, which would otherwise limit the output power of the class-D amplifier 200a. At low output power levels the booster can be switched off such that the output voltage of the booster VBST becomes equal to the battery voltage VBAT. To reduce switching losses, and achieve maximum efficiency, it is preferable that the supply voltage VBST of the class-D amplifier is as low as possible. However, VBST needs to be high enough to prevent the class-D amplifier 200a output voltage from clipping. This can be achieved by varying the supply voltage VBST such that it tracks the envelope of an audio input signal. Envelope tracking requires knowledge of the audio input signal before it reaches the class-D amplifier 200a to allow the booster enough time to ramp up and down. Also, due to the limited bandwidth of the booster, envelope tracking may only be possible for low audio frequencies that are within the bandwidth. For higher audio frequencies VBST needs to be at the peak level of the audio input signal to prevent the amplifier 200a from clipping. These requirements can result in a complicated system.

Figure 2B:
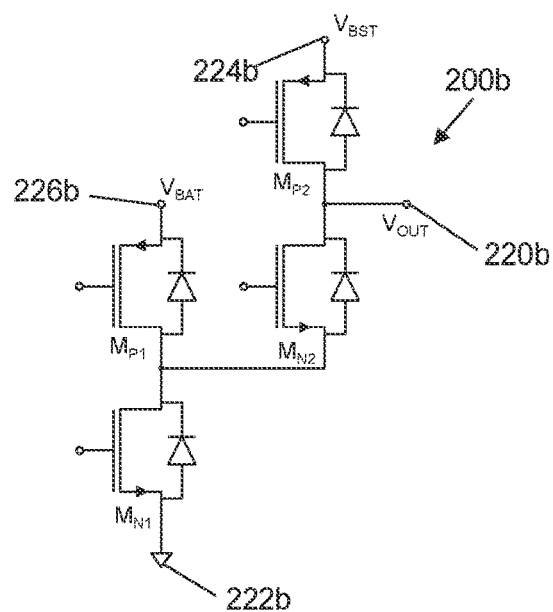

FIG. 2b shows an alternative class-D output stage 200b. In the alternative output stage 200b the output node VOUT 220b can be connected to either ground 222b, VBAT 226b or VBST 224b and can therefore be referred to as a 3-level class-D output stage. The topology of the alternative output stage 200b is one possibility to achieve a 3-level class-D output stage, although it will be appreciated that there are other possible topologies. With a 3-level class-D amplifier, the booster voltage VBST can be set at a fixed (maximum) level. For low audio input signal amplitudes, the output node VOUT 220b alternates between ground 222b and VBAT 226b and the booster VBST 224b is not connected. Only for higher output power will the output node 220b switch between VBAT 226b and VBST 224b. The switching patterns in the 3-level class-D output stage 200b are more complicated than the straightforward PWM signals that can be used to control the 2-level class-D output stage 200a of FIG. 2a. However, the bandwidth limitation and necessary timely knowledge of the audio input signal required for envelope tracking in the 2-level class-D output stage 200a are not needed. An important challenge is to make an analogue feedback loop around the 3-level output stage 200b to correct for timing and amplitude errors. Control of such a feedback loop will be discussed in detail below.

Figure 3:
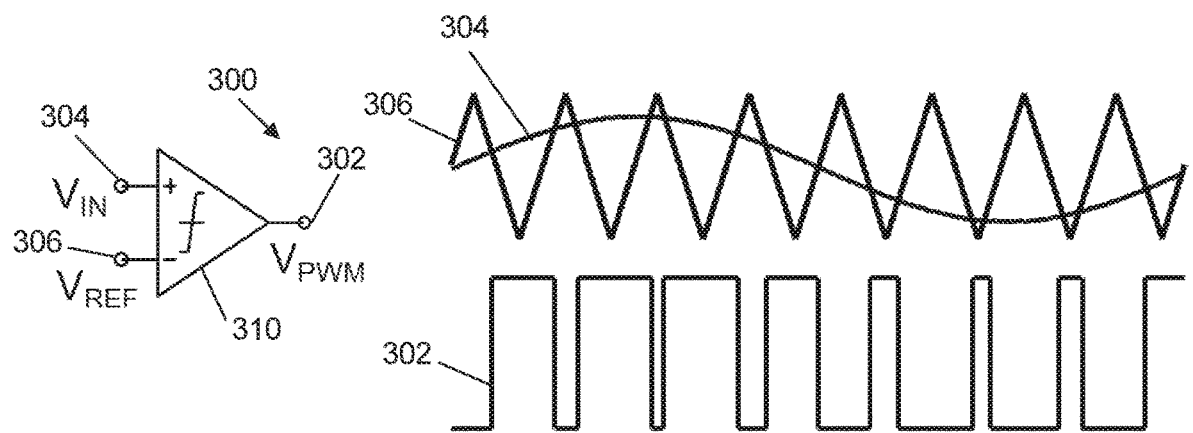
FIG. 3 shows an example of a method for generating a 2-level Pulse Width Modulation (PWM) signal.

FIG. 3 illustrates a method 300 for generating a 2-level PWM signal 302 by comparing a (low-frequency) input signal VIN 304 with a (high-frequency) triangular waveform VREF 306. The output signal 302 of the comparator 310 VPWM is the PWM signal 302, where the duty-cycle of the PWM signal 302 is proportional to the value of the input signal VIN 304. The PWM signal 302 can be used to drive a 2-level class-D output stage, such as the one shown in FIG. 2a.

Figure 4:
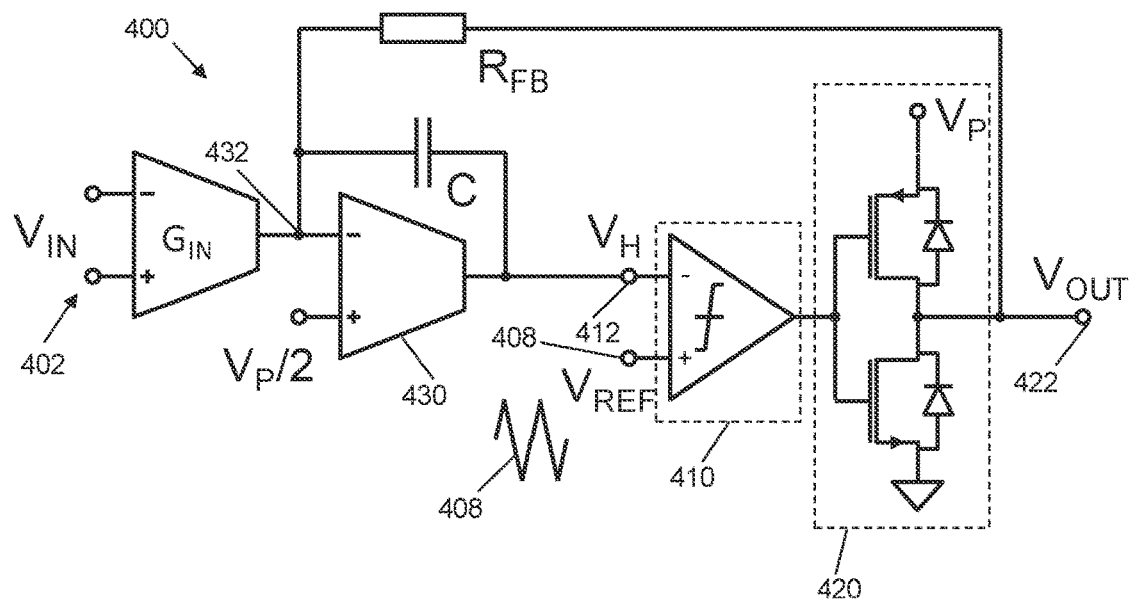
FIG. 4 shows an example of a feedback loop circuit.

FIG. 4 shows a class-D amplifier 400 with a 1st order PWM feedback loop. The class-D amplifier 400 includes an integrator 430, a comparator 410, and an output stage 420. The comparator 410 compares an integrator-output-signal $V_H$ 412 with a triangular reference waveform VREF 408. In this example, the integrator-output-signal $V_H$ 412 that is compared with the reference triangle VREF 408 is not the input signal $V_{IN}$ 402, but the difference between the input signal $V_{IN}$ 402 and the output signal $V_{OUT}$ 422 that is fed through the integrator 430 thus creating a first order loop filter. In this way, (i) a signal that is representative of the input signal $V_{IN}$ 402, and (ii) a signal that is representative of the output signal $V_{OUT}$ 422, are connected to the same input terminal 432 of the integrator 430, thereby defining a virtual ground node. Therefore, a PWM generator and the class-D output stage 420 can be incorporated in a feedback loop as shown in FIG. 4. It will be appreciated that the circuit 400 has been simplified for the sake of clarity. The loop filter circuit 400 has a first order transfer function, but in other examples a second or higher order loop filter can be used to increase loop gain in the audio frequency band and reduce distortion. Furthermore, the gates of power transistors in the output stage 420 may not be driven directly by the comparator 410, but by dedicated gate driver circuits (not shown).

Figure 5:
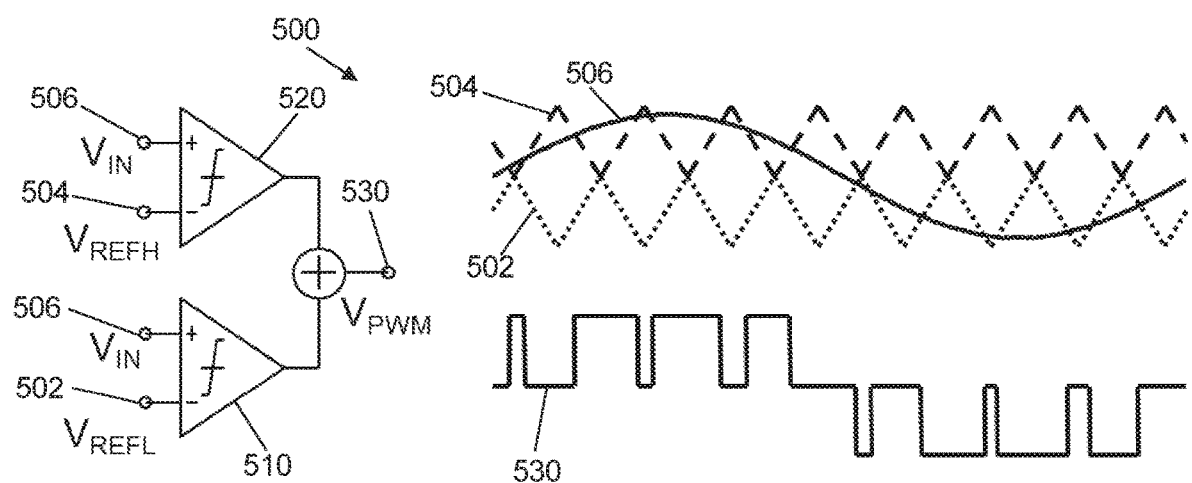
FIG. 5 shows an example of a method for generating a 3-level PWM signal by using two reference triangle signals.

FIG. 5 illustrates a method 500 whereby the 2-level PWM generation of FIG. 3 can be extended to generate a 3-level PWM signal by using two reference triangle signals VREFL 502 and VREFH 504. An input signal VIN 506 is compared, by a first comparator 510 and a second comparator 520, with the first reference triangle signal VREFL 502 and the second reference triangle signal VREFH 504 respectively, and the outputs of the comparators 510, 520 are summed to generate a 3-level PWM signal 530.

Figure 6:
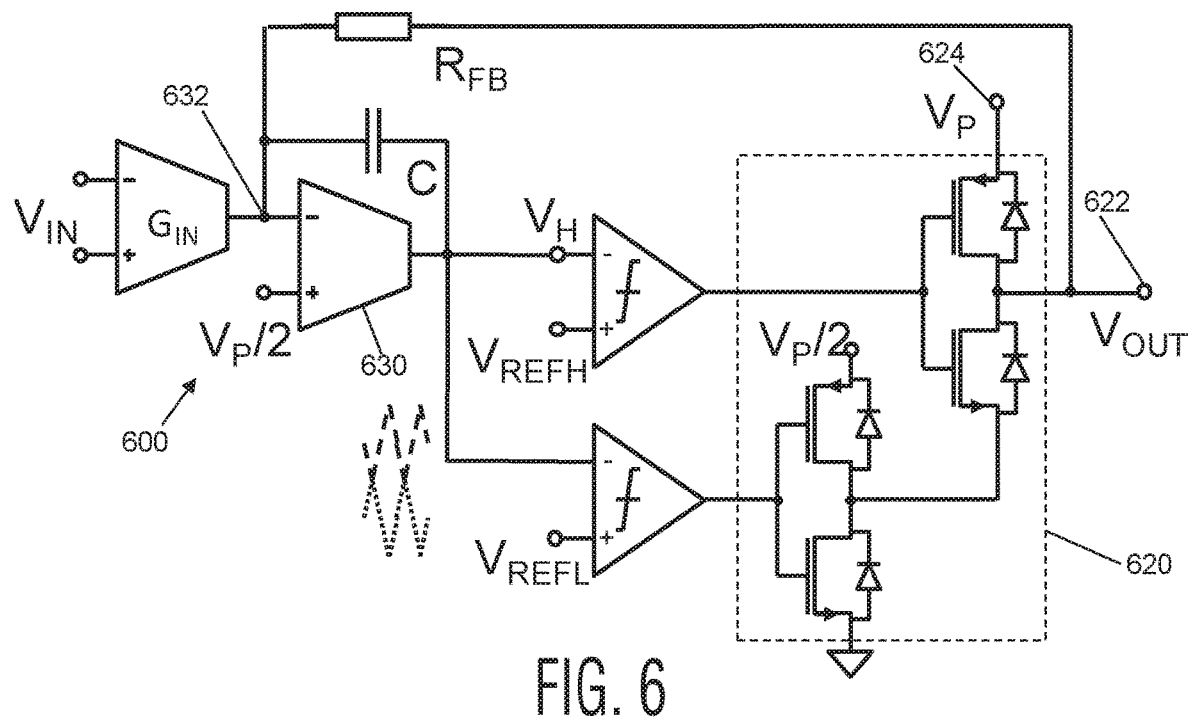
FIG. 6 shows an example of a 3-level PWM circuit.
Figure 12:
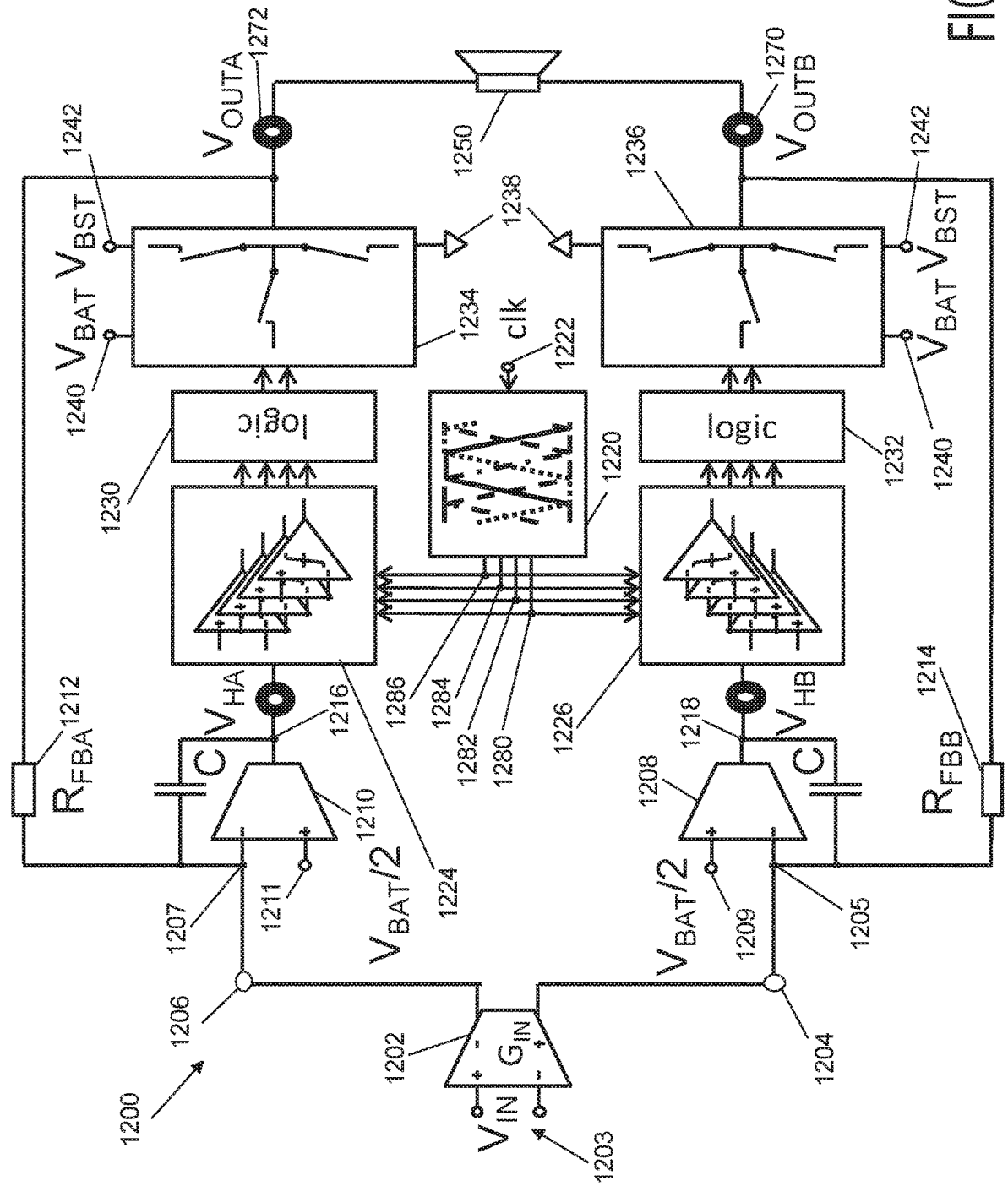
FIG. 12 shows an example embodiment of a 3-level Class-D amplifier in a bridge-tied-load configuration that uses the trapezoidal reference signals of FIG. 11.

FIG. 6 shows a Class-D amplifier 600 with a 3-level PWM feedback loop. The Class-D amplifier 600 of FIG. 6 has a similar feedback loop to that shown in FIG. 4 for a 2-level PWM circuit. Here the same simplifications as in FIG. 4 apply. The amplifier 600 has a supply voltage VP 624. In the 3-level PWM circuit 600 the 3-level output stage switches symmetrically around half the supply voltage VP 624, that is around VP/2. Consequently, the average value of VOUT 622 equals the value at the virtual ground node 632 of the integrator 630 which is also at VP/2. If two amplifiers 600 are provided in parallel in a BTL configuration (not shown in FIG. 6, although a BTL configuration is shown in FIG. 12), as discussed further below, this will mean that the average common-mode voltage of the integrator outputs will also be set equal to VP/2.

Although the extension of the 2-level PWM feedback loop shown in FIG. 4 to the 3-level PWM feedback loop 600 may appear straightforward, there are some technical problems with implementation of the 3-level PWM feedback loop 600: the generation of the reference triangle signals can be problematic, control of the output common-mode level can be problematic, and recovery from clipping can also be problematic.

Figure 7A:
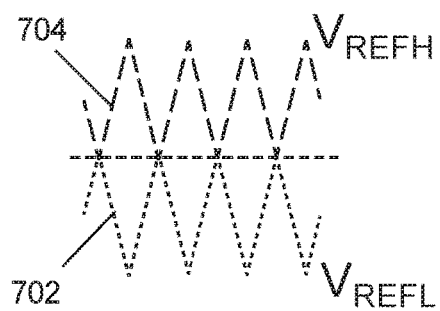
FIGS. 7a, 7b and 7c show an example illustration that explains why the generation of two synchronized reference triangle signals is not straightforward.
Figure 7B:
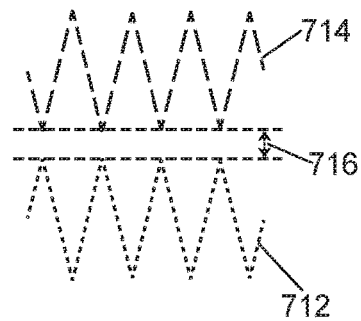
Figure 7C:
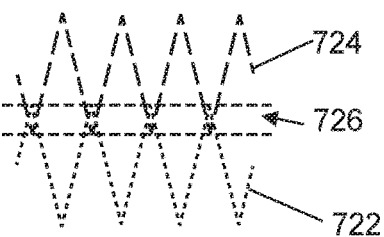

FIGS. 7a, 7b and 7c illustrate graphically why the generation of two synchronized reference triangle signals is not a straightforward problem to solve. FIG. 7a shows a first ideal example of a low voltage reference triangle signal VREFL 702 and a high voltage reference triangle signal VREFH 704. Voltage is represented by the vertical axis and time is represented by the horizontal axis. The top of the low voltage reference triangle signal VREFL 702 is accurately aligned with the bottom of the high voltage reference triangle signal VREFH 704. Achieving this alignment with perfect accuracy is not practically possible since any voltage signal will always be subject to some margin of error. For example, in a first non-ideal case, as shown by FIG. 7b, there is a gap 716 between a low voltage reference triangle signal 712 and a high voltage reference triangle signal 714. In a second non-ideal case, as shown by FIG. 7c, there is an overlap 726 between a low voltage reference triangle signal 722 and a high voltage reference triangle signal 724. When there is either a gap or overlap between the respective reference triangle signals, the resulting 3-level PWM signal will disadvantageously suffer from cross-over distortion.

Figure 8:
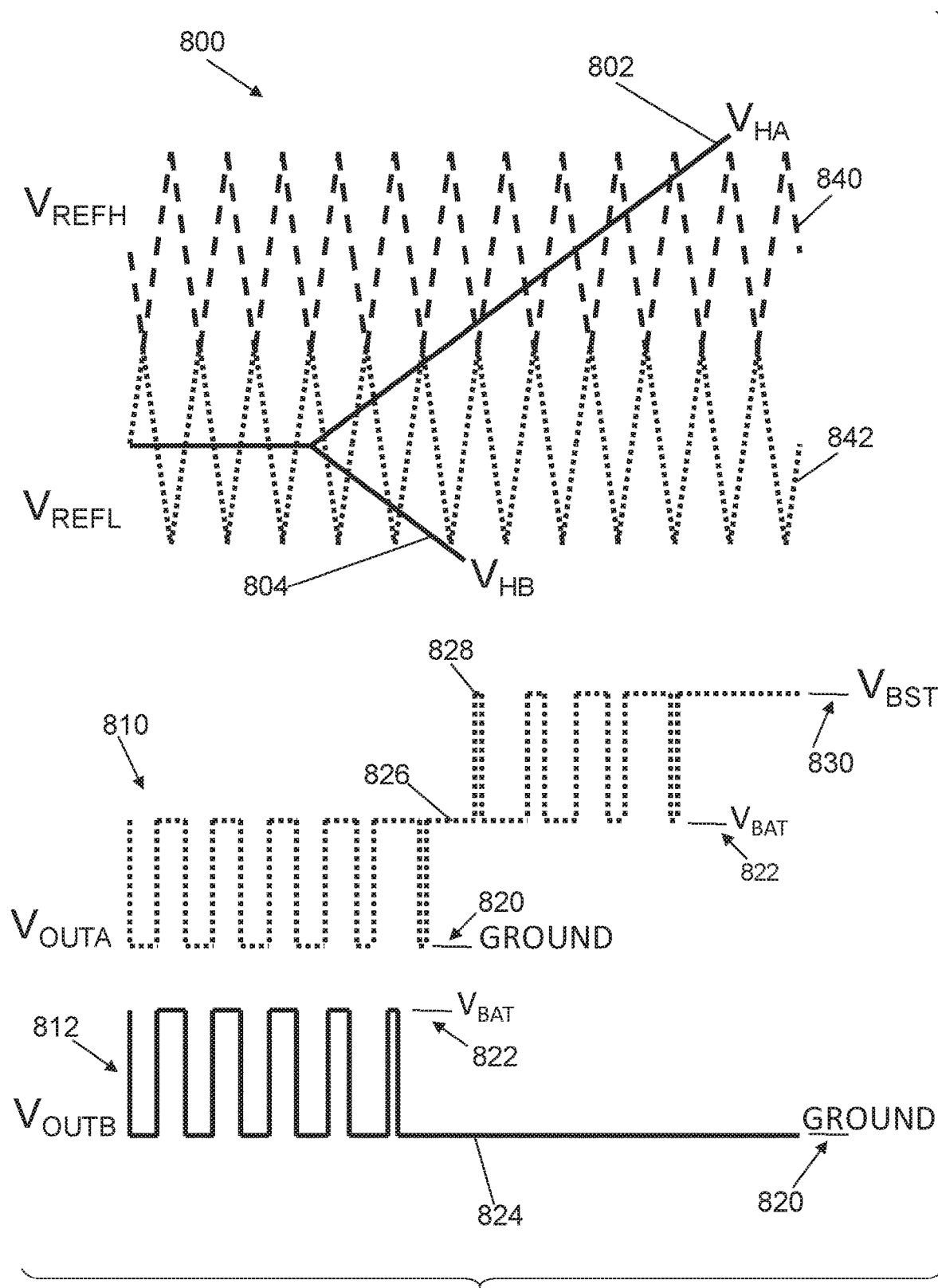
FIG. 8 shows an example illustration that explains a problem that can arise in the common-mode level of the output of a 3-level Class-D amplifier with a bridge-tied-load configuration.

FIG. 8 provides a set of charts 800 that illustrate the origin of another problem that can arise in a smart speaker driver application, where a 3-level class-D output stage is supplied by the battery voltage VBAT and a boosted voltage VBST that is equal to, or higher than, VBAT. In order to improve efficiency, the boosted voltage VBST should be loaded only when necessary, such as when high output power levels are required. This means that at low output power levels, the pair of amplifier outputs VOUTA 810 and VOUTB 812, of a BTL configuration, should switch between ground 820 and VBAT 822, whereas at high output power levels one bridge-half, which in this example is VOUTB 812, should switch permanently to ground 824, while the other output VOUTA 810 starts switching between VBAT 826 and VBST 828.

In FIG. 8 the signals VHA 802 and VHB 804 are the outputs of the integrators included in each of the bridge-halves of the BTL circuit, such as the circuit of FIG. 12 which will be discussed in greater detail below. The signals VHA 802 and VHB 804 are the BTL circuit counterparts to the integrator-output-signal $V_H$ discussed above in relation to the single amplifier circuit shown in FIG. 4. The average common-mode level of the output nodes VOUTA and VOUTB will depend on the output signal supplied to those output nodes. When the input signal (not shown) has a zero value (as represented by the left side of FIG. 8) the outputs VOUTA 810 and VOUTB 812 are both switching between ground 820 and VBAT 822 with a 50% duty-cycle, so the average common-mode level is VBAT/2. When the input signal has a maximum value (as represented on the right side of FIG. 8) the output VOUTB 812 is permanently switched to ground 824 while the output VOUTA 810 is permanently switched to VBST 830. This is because VHA 802 and VHB 804 no longer have any crossings with either VREFH 840 or VREFL 842, as will be discussed below. Therefore, the average common-mode output level is VBST/2. This does not work well with a control loop such as that shown in FIG. 6 above, that requires the output common-mode level to equal the virtual ground voltage of the integrator inputs, which in this case would be VBAT/2, not VBST/2. Deviations away from the matching of the virtual ground voltage with the average common-mode output level can result in an increase in total harmonic distortion of the output signal provided by the amplifier. Therefore, a mechanism is needed to regulate the common-mode level at the outputs.

As can be seen on the right side in FIG. 8, the outputs VOUTA 810 and VOUTB 812 stop switching when outputs VHA 802 and VHB 804 of the integrators in the feedback loop of both bridge-halves go beyond the range of the reference triangles VREFH 840 and VREFL 842 to levels that constitute an over-voltage. The term over-voltage applies to both voltages that are too low, and to voltages that are too high. At this point the amplifier is said to be clipping because the output cannot follow the input. Consequently, the integrators in the feedback loop of both bridge-halves will start to diverge. When the input signal is reduced again to below the over-voltage level, it can take some time for the integrators to return to their steady-state behaviour, because the over-voltage will have driven them into saturation.

Figure 9:
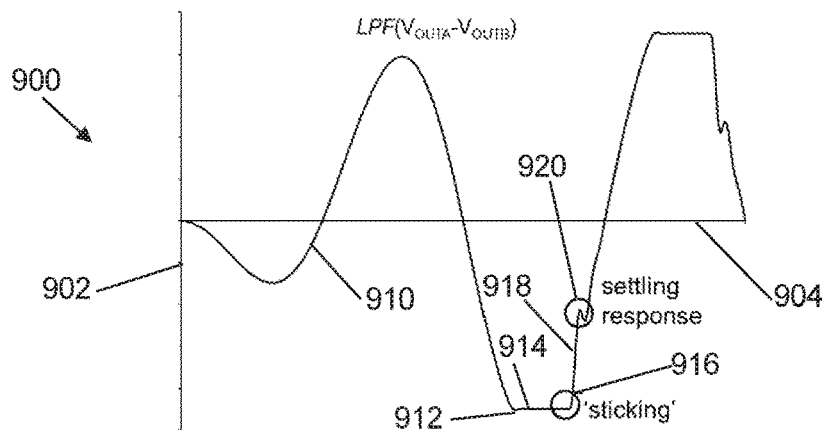
FIG. 9 shows an example of a chart illustrating problems that can arise in the output of a 3-level Class-D amplifier when clipping occurs.

FIG. 9 shows a chart 900 that illustrates problems that can result when a Class-D amplifier is driven at an over-voltage. The chart 900 shows output voltage on a vertical axis 902 against time on a horizontal axis 904. The chart 900 plots a low-pass filtered output of a class-D amplifier with a 2nd order loop filter that is driven into clipping. An initial portion of the chart 900 shows the output voltage following a smooth sinusoidal path 910 because the amplifier is operating within its voltage limits and is not clipping. At a first clipping point 912 the input voltage becomes too large and the amplifier clips the output to a constant clipping value 914. The integrator is consequently driven into saturation. This results in so-called 'sticking' behaviour 916, where the output remains at the clipping value 914 after the input has returned to less than the over-voltage level. After the sticking behaviour 916 has ended, the output moves away from the clipping value 914 in a post-sticking portion 918. This post-sticking portion 918 of the output is followed by a settling response 920 of the loop filter, which also represents an undesired artefact in the output signal.

These clipping artefacts, the sticking and settling responses, can be quite audible when the output is applied to a loudspeaker, and are therefore highly undesirable. A mechanism for improving the clipping recovery behaviour of a PWM feedback loop is described below.

Figure 10:
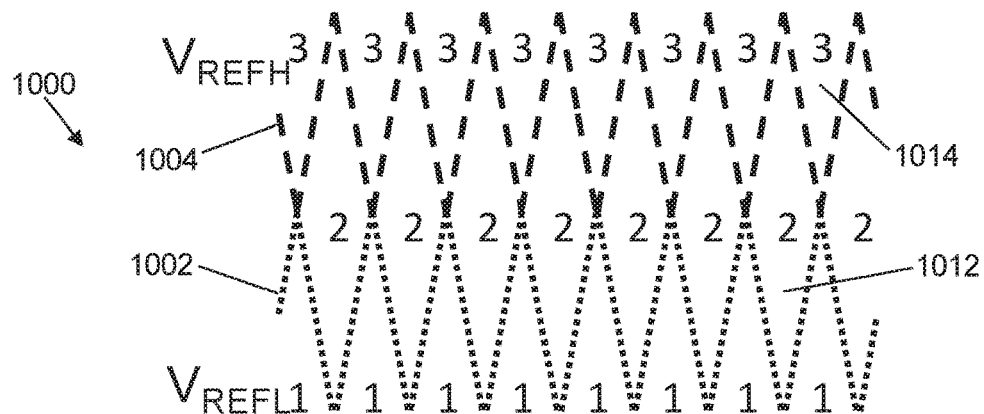
FIG. 10 shows an example of two aligned triangular reference signals that divide a voltage space into three regions.

FIG. 10 shows a pair of triangular reference signals 1000 as discussed above in relation to FIGS. 7a, 7b, 7c and 8. The use of these triangular reference signals 1000 to generate a 3-level PWM signal can contribute to the three problems mentioned above, that is: cross-over distortion, distortion from lack of common-mode regulation, and clipping artefacts. As explained earlier, one method to generate a 3-level PWM signal is to use two accurately aligned reference triangle signals and two comparators to compare the amplifier input signal to the reference triangle signals. By summing the outputs of the comparators, it can be determined if the input signal is in region '1' 1010 (that is below a lower reference triangle signal VREFL 1002), in region '2' 1012 (that is between the lower reference triangle signal VREFL 1002 and a higher reference triangle signal VREFH 1004) or in region '3' 1014 (that is above the higher reference triangle signal VREFH 1004). Then, the output stage of the amplifier can be operated based on the region in which the input signal is identified. When the input signal changes regions, the state of the output stage is changed and at least one of the output signals (VOUTA and VOUTB) is changed.

Figure 11:
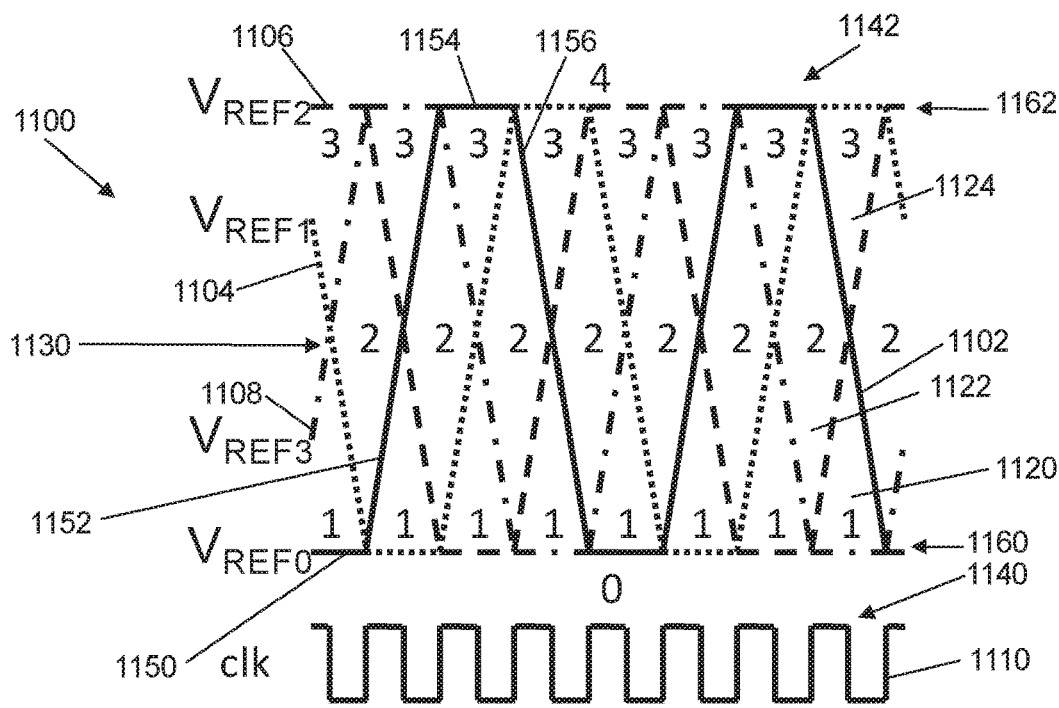
FIG. 11 shows an example embodiment of a set of four trapezoidal reference signals that divide a voltage space into five regions.

FIG. 11 illustrates a set of reference signals that can be used to generate a 3-level PWM signal. The set of reference signals includes four trapezoidal waveforms 1100 that are shifted in phase with respect to each other. The four trapezoidal waveforms 1100 include a first trapezoid VREF0 1102, a second trapezoid VREF1 1104, a third trapezoid VREF2 1106, and a fourth trapezoid VREF3 1108. As will be described below, four comparators can be used to compare the amplifier input signal to each of the trapezoidal reference signals 1100 in order to determine which region the input signal is in. The trapezoids 1100 can be synchronized to an external clock signal clk 1110 that sets a target PWM frequency. The period time of the trapezoids 1100 is four times the PWM period time, in this example.

The first trapezoid VREF0 1102 is an example of a first-reference-signal. The first trapezoid VREF0 1102 is periodic, with a predetermined period, and has: a low-signal-portion 1150 with a bottom-level configured to demarcate signal levels below a low-value 1160; a rising-signal-portion 1152 that rises from the bottom-level via a midpoint-level 1130 to a top-level; a high-signal-portion 1154 at the top-level, configured to demarcate signal levels above a high-value 1162; and a falling-signal-portion 1156 that falls from the top-level via the midpoint-level 1130 to the bottom-level. The second trapezoid VREF1 1104 is an example of a second-reference-signal. The third trapezoid VREF2 1106 is an example of a third-reference-signal. The fourth trapezoid VREF3 1108 is an example of a fourth-reference-signal. Each of the second trapezoid VREF1 1104, the third trapezoid VREF2 1106, and the fourth trapezoid VREF3 1108 are different phase shifted representations of the first trapezoid VREF0 1102. In this example, the second trapezoid VREF1 1104 is phase shifted by one quarter of the predetermined period, the third trapezoid VREF2 1106 is phase shifted by one half of the predetermined period, while the fourth trapezoid VREF3 1108 is phase shifted by three quarters of the predetermined period.

FIG. 11 shows that the trapezoidal reference signals 1100 can be used to determine if an input signal is in a region one R1 1120 (corresponding to part of region 1 of FIG. 10), a region two R2 1122 (corresponding to region 2 of FIG. 10), or a region three R3 1124 (corresponding to region 3 of FIG. 10). Each of region one R1 1120, region two R2 1122 and region three R3 1124 can contain input signals that the amplifier will be able to process without clipping.

By using combinatorial logic on the outputs of the four comparators it is possible to determine if the input signal is in region one R1 1120, two R2 1122, or three R3 1124. For example, if the outputs of the four comparators that compare the input signal to reference signals VREF0 1102, VREF1 1104, VREF2 1106 and VREF3 1108 are COUT0, COUT1, COUT2 and COUT3 respectively, then the logic for determining which of the three regions R1 1120, R2 1122 and R3 1124 the input signal is contained within is:

$$R_1 \leftarrow (C_{OUT0} \wedge \overline{C_{OUT1}} \wedge \overline{C_{OUT2}} \wedge \overline{C_{OUT3}}) \vee$$
$$(\overline{C_{OUT0}} \wedge C_{OUT1} \wedge \overline{C_{OUT2}} \wedge \overline{C_{OUT3}}) \vee$$
$$(\overline{C_{OUT0}} \wedge \overline{C_{OUT1}} \wedge C_{OUT2} \wedge \overline{C_{OUT3}}) \vee$$
$$(\overline{C_{OUT0}} \wedge \overline{C_{OUT1}} \wedge \overline{C_{OUT2}} \wedge C_{OUT3})$$

$$R_2 \leftarrow (C_{OUT0} \wedge C_{OUT1} \wedge \overline{C_{OUT2}} \wedge \overline{C_{OUT3}}) \vee$$
$$(\overline{C_{OUT0}} \wedge C_{OUT1} \wedge C_{OUT2} \wedge \overline{C_{OUT3}}) \vee$$
$$(\overline{C_{OUT0}} \wedge \overline{C_{OUT1}} \wedge C_{OUT2} \wedge C_{OUT3}) \vee$$
$$(C_{OUT0} \wedge \overline{C_{OUT1}} \wedge \overline{C_{OUT2}} \wedge C_{OUT3})$$

$$R_3 \leftarrow (C_{OUT0} \wedge C_{OUT1} \wedge C_{OUT2} \wedge \overline{C_{OUT3}}) \vee$$
$$(\overline{C_{OUT0}} \wedge C_{OUT1} \wedge C_{OUT2} \wedge C_{OUT3}) \vee$$
$$(C_{OUT0} \wedge \overline{C_{OUT1}} \wedge C_{OUT2} \wedge C_{OUT3}) \vee$$
$$(C_{OUT0} \wedge C_{OUT1} \wedge \overline{C_{OUT2}} \wedge C_{OUT3})$$

One advantage of the trapezoidal waveforms 1100 is that the need for accurate alignment, that arises when using a pair of triangular waveforms as shown in FIG. 10, is no longer required. The possibility of a gap or overlap, that exists for two aligned triangles, simply does not exist for the trapezoidal waveforms 1100. Any incongruity between the four trapezoids 1100 translates to a shift in the exact time and level of the crossings of respective pairs of the trapezoidal waveforms 1100 around the middle region 1130, which is equivalent to having an offset in one or more of the four comparators. This can be less problematic than the issues discussed above in relation to FIGS. 7b and 7c, where gaps or overlaps arise in a pair of triangular reference signals.

A second advantage of using the trapezoidal reference signals 1100 relates to problems of common-mode control and clipping recovery. By using the trapezoidal reference signals 1100 it is also possible to detect when the amplifier input signal is outside the range of the trapezoidal reference signals by detecting when the input signal is in either Region 0 (R0) 1140 or Region 4 (R4) 1142. Region 0 (R0) 1140 is below all the trapezoidal reference signals 1100, while region 4 (R4) 1142 is above all the trapezoidal reference signals 1100. Instead of being able to distinguish just three regions, as in the case of the aligned triangle reference signals of FIG. 10, the trapezoidal reference signals can distinguish five regions. The logic required to identify input signals in the two additional regions is:

$$R_0 \leftarrow (\overline{C_{OUT0}} \wedge \overline{C_{OUT1}} \wedge \overline{C_{OUT2}} \wedge \overline{C_{OUT3}})$$
$$R_4 \leftarrow (C_{OUT0} \wedge C_{OUT1} \wedge C_{OUT2} \wedge C_{OUT3})$$

FIG. 12 shows a schematic diagram of a Class-D amplifier circuit 1200 with a 5-level BTL configuration and a 3-level PWM feedback loop. Components in one bridge-half are similar to corresponding components in the other bridge-half, and may not necessarily be described separately. At the external input 1203 is a fully-differential V/I converter $G_{IN}$ 1202 that transforms an external input signal $V_{IN}$ into differential currents that are injected into virtual ground nodes 1205, 1207 of two loop integrators 1208, 1210. The differential currents are examples of input-signals. The differential currents are injected via an input-terminal 1204, and a second-input-terminal 1206.

The circuit 1200 has a load 1250 connected between an output-terminal VOUTB 1270 and a second-output-terminal VOUTA 1272. The load 1250 in this example is a loudspeaker. The output-terminal VOUTB 1270 can provide an output-signal to one side of the load 1250, while the second-output-terminal VOUTA 1272 can provide a second-output-signal to a second side of the load 1250.

The loop integrators 1208, 1210 are coupled to the input-terminal 1204 and the second-input-terminal 1206, respectively. The virtual ground nodes 1205, 1207 are also coupled to the output-terminal 1270 and the second-output-terminal 1272 respectively, such that the virtual ground nodes receive feedback signals through feedback resistor RFBA 1212 and feedback resistor RFBB 1214, respectively. The loop integrators 1208, 1210 generate feedback-voltage-signals by integrating a difference between the input-signal and the output-signal, as received at the virtual ground nodes 1205, 1207. The feedback-voltage-signals can also be referred to as comparator-input-voltage-signals. In this example, each loop integrator 1208, 1210 has a reference-node 1209, 1211 coupled to a voltage signal that is half of a middle-voltage-level, that is VBAT/2. The voltage signal (VBAT/2) provided to the reference-nodes 1209, 1211 of the loop integrators 1208, 1210 can also be referred to as an integrator-reference-voltage. The signal integrated by each integrator 1208, 1210 is the difference between the input-signal and the output-signal, subtracted from the voltage-signal (VBAT/2).

A reference circuit 1220, which is an example of a central block, generates the four trapezoidal reference signals that are synchronized with an external clock signal clk 1222. The reference circuit 1220 has a first output terminal 1280 to provide a first-reference-signal, a second output terminal 1282 to provide a second-reference-signal, a third output terminal 1284 to provide a third-reference-signal, and a fourth output terminal 1286 to provide a fourth-reference-signal. In this example, all of the reference signals 1280, 1282, 1284, 1286 are trapezoidal reference signals.

The trapezoidal reference signals and the voltages VHA 1216 and VHB 1218 generated by the loop integrators 1210, 1208 are fed to two banks 1224, 1226 of four comparators. The voltages VHA 1216 and VHB 1218 are examples of feedback-voltage-signals that can also be referred to as comparator-input-voltage-signals. In some examples, the two banks 1224, 1226 of comparators can be provided as a single comparator block which can be configured to generate a comparison-signal as an output by comparing the output voltages VHA 1216 and VHB 1218 with the reference signals 1280, 1282, 1284, 1286. The output signals of the comparators 1224, 1226 are provided to logic blocks 1230, 1232 that implement equations (1)-(5) presented above, and control the 3-level output stages 1234, 1236. The logic blocks 1230, 1232 are each examples of a control block that sets the output signal of each output stage 1234, 1236 based on the comparison-signal.

The 3-level output stages 1234, 1236 have ground 1238 (or a ground-voltage-level, which may be a floating ground in some cases), VBAT 1240 and VBST 1242, as supplies. In the BTL configuration the differential output signal VOUTA-VOUTB can have one of five possible output levels: −VBST, −VBAT, 0, +VBAT and +VBST. VBAT 1240, which may be a battery voltage, is an example of a middle-voltage-level, which is greater than the ground-voltage-level. VBST 1242 is an example of a boost-voltage-level, which is greater than the middle-voltage-level.

The circuit 1200 can set the output-signal VOUTA to a ground-voltage-level if the feedback-voltage-signal crosses a rising-signal-portion of a trapezoidal reference signal below the midpoint-level of the trapezoidal reference signal (that is, if it transitions from a region '2' to a region '1', where the regions are as shown in FIG. 11). The circuit 1200 can set the output-signal to the middle-voltage-level, if the feedback-voltage-signal crosses a falling-signal-portion, below the midpoint-level, of a trapezoidal reference signal (that is, if it transitions from a region '1' to a region '2'). The circuit 1200 can set the output-signal to the boost-voltage-level, if the feedback-voltage-signal crosses a falling-signal-portion above the midpoint-level (that is, if it transitions from a region '2' to a region '3'). The circuit 1200 can also set the output-signal to the middle-voltage-level if the feedback-voltage-signal crosses a rising-signal-portion above the midpoint-level of a trapezoidal reference signal (that is, if it transitions from a region '3' to a region '2'). The circuit 1200 can set the second-output-signal VOUTB in a similar way.

Figure 13A:
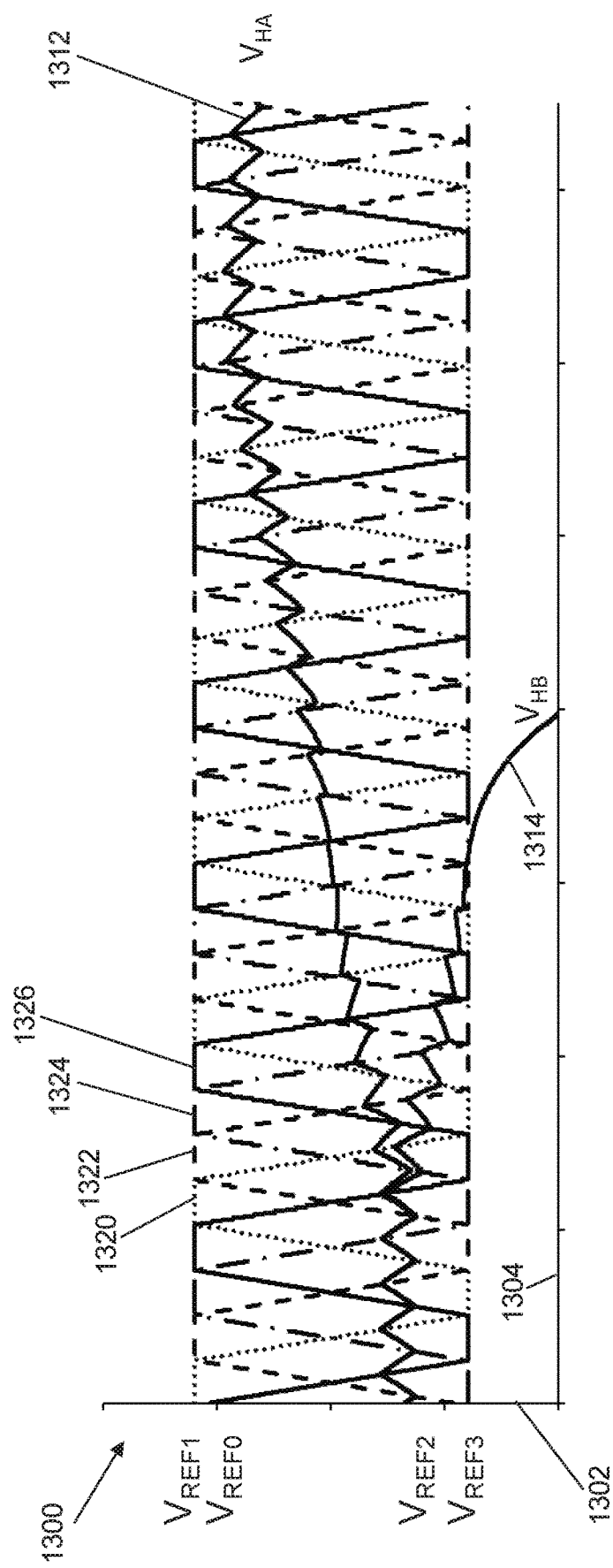
FIGS. 13a and 13b show an example embodiment of charts of voltage signals in the 3-level Class-D amplifier of FIG. 12.
Figure 13B:
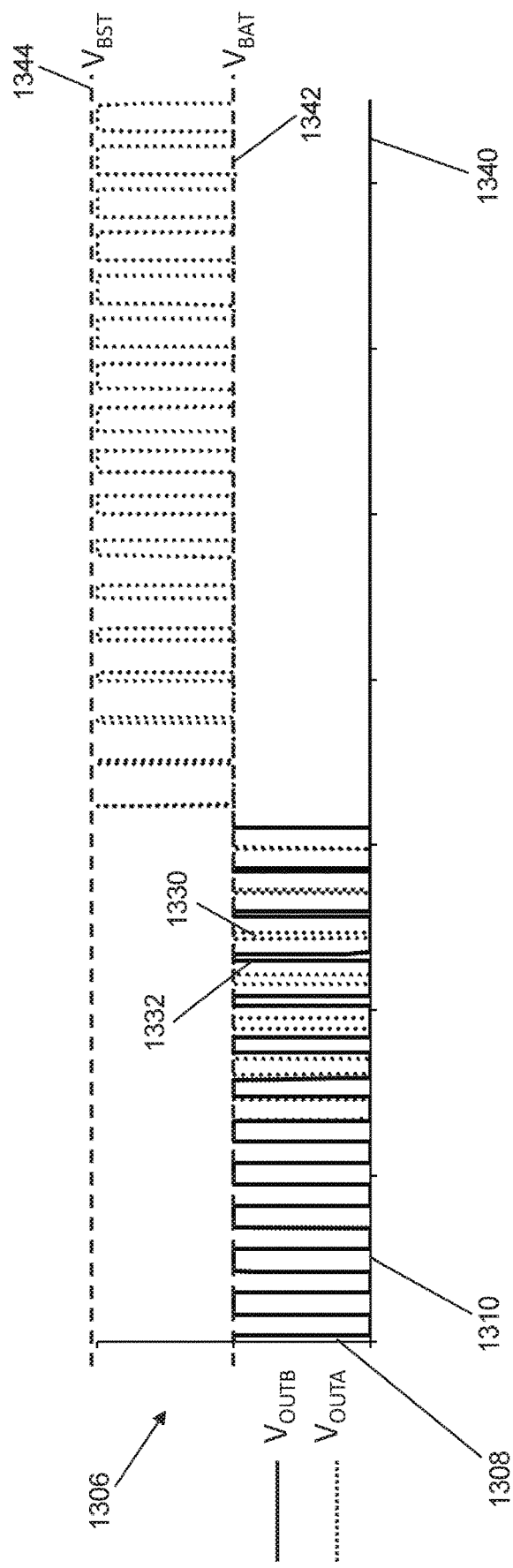

FIGS. 13a and 13b show a first chart 1300 of the loop integrator output voltages VHA 1312 and VHB 1314, and the reference trapezoid signals VREF0 1320, VREF1 1322, VREF2 1324 and VREF3 1326 generated by the circuit shown in FIG. 12. The first chart 1300 shows voltage on a vertical axis 1302 and time on a horizontal axis 1304. A second chart 1306 shows the output signals VOUTA 1330 and VOUTB 1332 when the input signal VIN (not shown) is ramped up from zero to full-scale. The second chart 1306 shows voltage on a vertical axis 1308 and time on a horizontal axis 1310.

At zero input signal the output signals VOUTA 1330 and VOUTB 1332 are switching between ground 1340 and VBAT 1342 with a 50% duty-cycle as can be seen on the left side of FIGS. 13a and 13b. This yields an average common-mode level at the output of VBAT/2 which matches the common-mode voltage at the virtual ground nodes of the loop integrators. The loop integrator outputs VHA 1312 and VHB 1314 have a triangular shape because they are the integrals of the square wave output signals 1330, 1332.

When the input signal is increased the loop integrators move away from the steady-state. Integrator output signal VHA 1312 moves upwards causing the duty-cycle of VOUTA 1330 to increase and integrator output VHB 1314 moves downwards causing the duty cycle of VOUTB 1332 to decrease. Initially, the average common-mode value at the output remains at VBAT/2. At a certain level of the input signal, in the middle of the first chart 1300, integrator output VHB 1314 falls below the range of the trapezoid references 1320, 1322, 1324, 1326 and VOUTB 1332 is switched permanently to ground 1340. At about the same time integrator output VHA 1312 crosses the middle of the trapezoid references 1320, 1322, 1324, 1326 and output VOUTA 1330 starts switching between VBAT 1342 and VBST 1344. Since VOUTB 1332 has stopped switching it does not contribute a differential output across the loudspeaker load anymore and the differential gain of the amplifier is halved, which can cause substantial distortion.

Figure 14A:
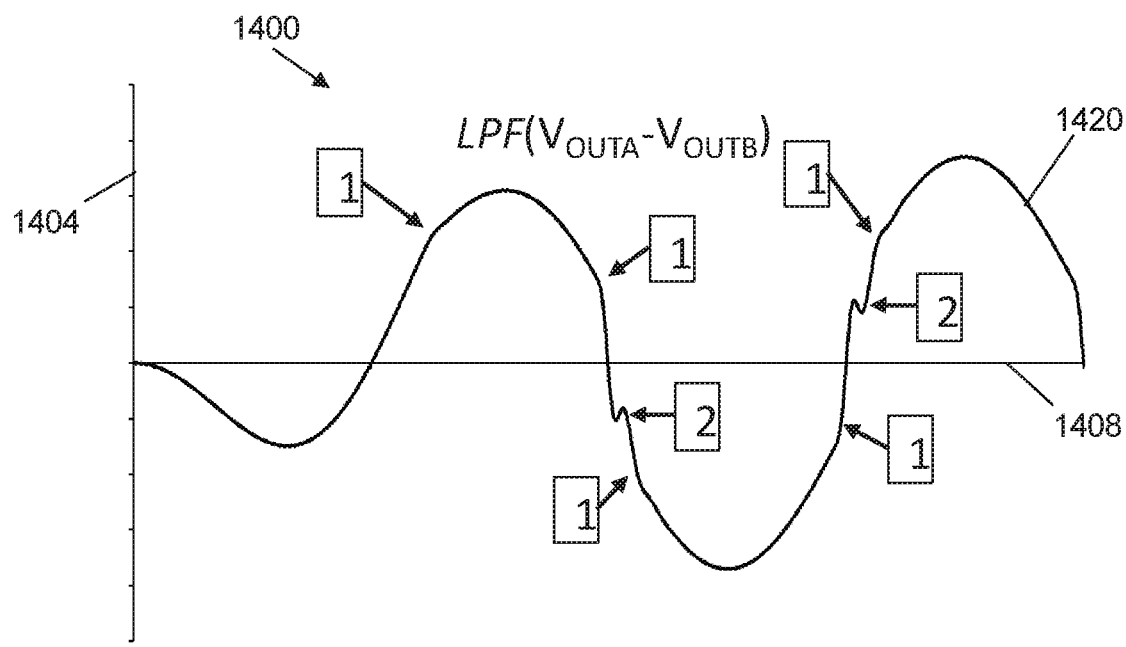
FIGS. 14a and 14b show an example embodiment of charts that illustrate problems in the output voltages of the 3-level Class-D amplifier of FIG. 12.
Figure 14B:
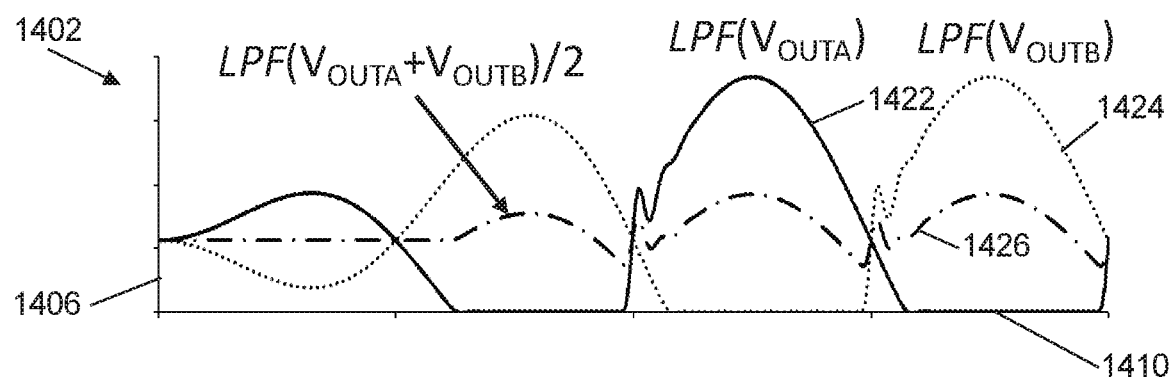

FIGS. 14a and 14b show two charts 1400, 1402 of the output signals of a class-D amplifier, after low-pass filtering, with a sinewave of increasing amplitude as an input signal. Both charts 1400, 1402 show voltage on vertical axes 1404, 1406 and time on horizontal axes 1408, 1410. The upper trace 1420 shows the differential output signal that appears across the loudspeaker load. The lower traces 1422, 1424, 1426 show the single-ended outputs 1422, 1424 and their common-mode 1426. The locations marked with a '1' clearly show a kink in the differential output at the moment either of the single-ended outputs bottoms out at ground level. Also, it can be seen at the locations marked with a '2' that the recovery from this state results in the same 'sticking' and settling response as is typical for clipping recovery. This arises because the single-ended output is essentially clipping to ground.

Figure 15:
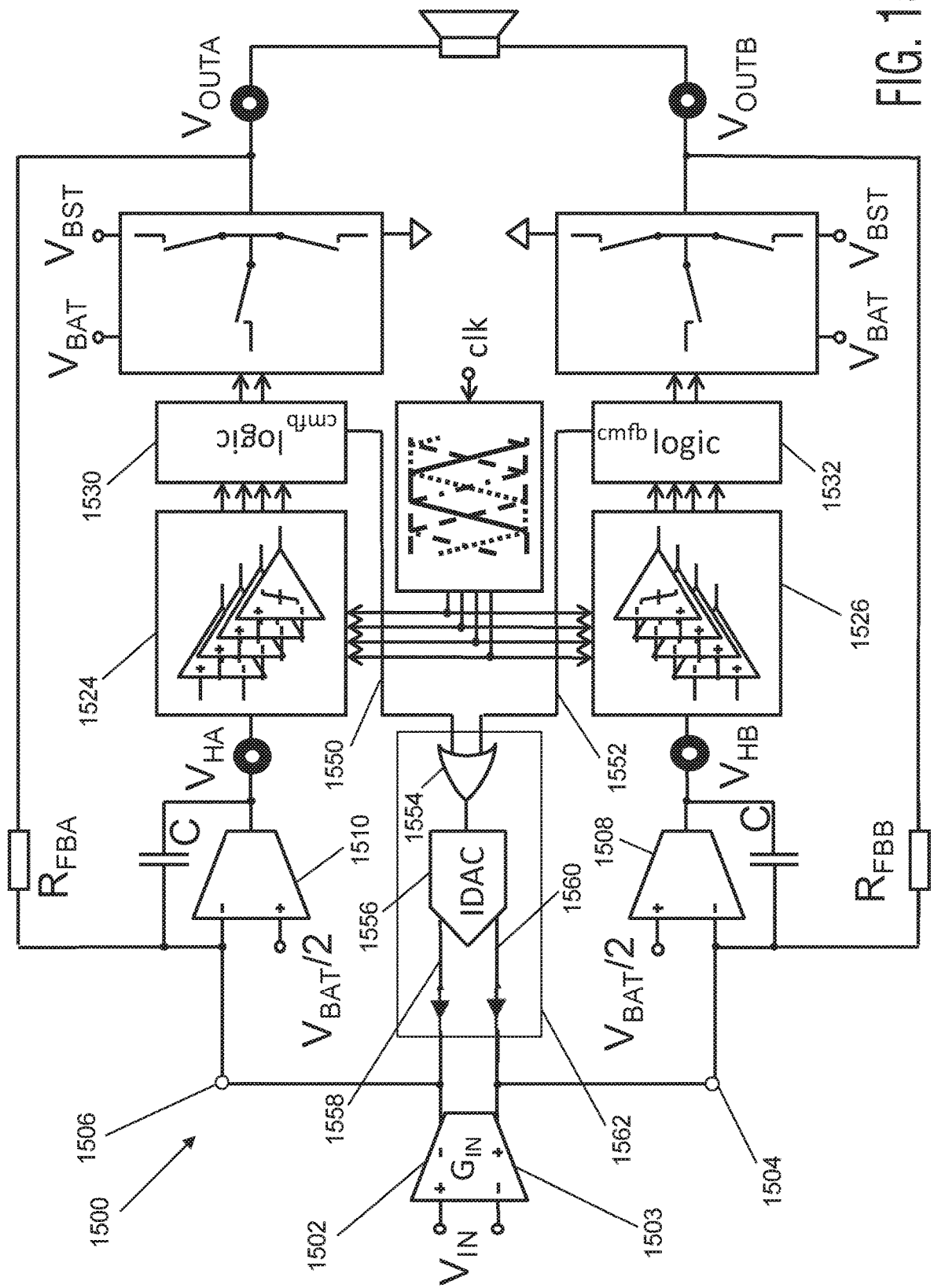
FIG. 15 shows an example embodiment of a 3-level Class-D amplifier, similar to that shown in FIG. 12, with an additional input-control-circuit for performing common-mode control.

FIG. 15 shows a 3-level PWM feedback loop circuit 1500, similar to that shown in FIG. 12, where similar features have been given similar reference numerals and may not necessarily be discussed further here.

Combinatorial logic blocks 1530, 1532 of the bridge-halves can both produce a common-mode-feedback signal 'cmfb' 1550, 1552, based on the comparison-signal provided by the comparator blocks 1524, 1526. The common-mode-feedback signal 1550, 1552 is fed to a logic OR block 1554 which controls a one-bit current Digital-to-Analogue Converter (DAC) 1556. The one-bit current DAC 1556 and the logic OR block 1554 together comprise an example of an input-control-circuit 1562. The one-bit current DAC 1556 is an example of a current-pulse-block, which in this example is a common-current-pulse-block. A current-pulse-block or a common-current-pulse-block can be referred to as a pulse-block. In response to receiving a common-mode-feedback signal 1550, 1552 from either bridge-half, the one-bit current DAC 1556 provides identical common-mode output currents 1558, 1560 to the input-terminal 1504 and the second-input-terminal 1506. The common-mode output currents 1558, 1560, which can also be described as a current pulse or a common-current-pulse, are examples of a feedback-control-signal. The feedback-control-signal supplied to the second-input-terminal can also be referred to as a second-feedback-control-signal. If the integrator output VHA or VHB of either bridge-half falls below the low-value of any trapezoidal reference, then the common-mode output currents 1558, 1560 will provide a current sink to the input terminals 1504, 1506 to prevent, or reduce the likelihood of, the integrator diverging, while at the same time the missing signal part is added to the opposite bridge-half. The current sink is provided to the input-terminal 1504 and the second-input-terminal 1506 until the integrator output VHA or VHB increases sufficiently to reach, or cross, the low-signal-portion of one of the trapezoidal reference signals. The current sink is an example of a pulse that adds to the input-signal.

To determine whether to apply a current pulse to the input terminals 1504, 1506, the logic blocks 1530, 1532 monitor the comparison signal. If the comparison signal indicates that the integrator output signal VHA or VHB has entered region 0, because the voltage has fallen below the low-value, then the logic block 1530, 1532 starts a timer. If the comparison-signal does not change within a predetermined time, which can be equal to one period of the clock signal used to generate the trapezoidal reference signals (as illustrated in FIG. 11), then the logic block 1530, 1532 sets the common-mode-feedback signal 1550, 1552 to provide the common-mode output currents 1558, 1560. Conversely, if the comparison-signal indicates that the integrator output signal VHA or VHB has crossed a trapezoidal reference signal, such that the integrator output signal VHA or VHB is in a region 1, then the logic block 1530, 1532 does not need to generate any common-mode-feedback signal.

The functionality of the timer referred to above may not require any additional circuitry. The trapezoidal reference signals can be synchronized with an external clock signal. The rising edges of the clock signal coincide with the different phases of the trapezoids. If the integrator output signal VHA or VHB is in region 0 at a rising clock edge, then the common-mode feedback signal 1550, 1552 can be set to provide the common-mode output currents 1558, 1560.

When the logic block 1530, 1532 generates a common-mode-feedback signal 1550, 1552 the logic block continues to generate the common-mode-feedback signal 1550, 1552 until the integrator output signal VHA or VHB crosses a trapezoidal reference signal, as indicated by a suitable change in the comparison-signal. Then, the logic block 1530, 1532 stops generating the common-mode-feedback signal 1550, 1552, because a current pulse is no longer needed at the input terminals.

In this example, the pulse-block is the one-bit current DAC 1556, which operates to change the integrator input signal, and therefore also the integrator output signal VHA or VHB, by applying a pulse signal to the input-terminal 1504 and the second-input-terminal 1506 in the current domain. However, it will be appreciated that in other examples (not shown) a pulse-block may operate in the voltage domain, by providing a voltage pulse, or may operate in the digital domain, by providing a digital pulse.

Figure 16A:
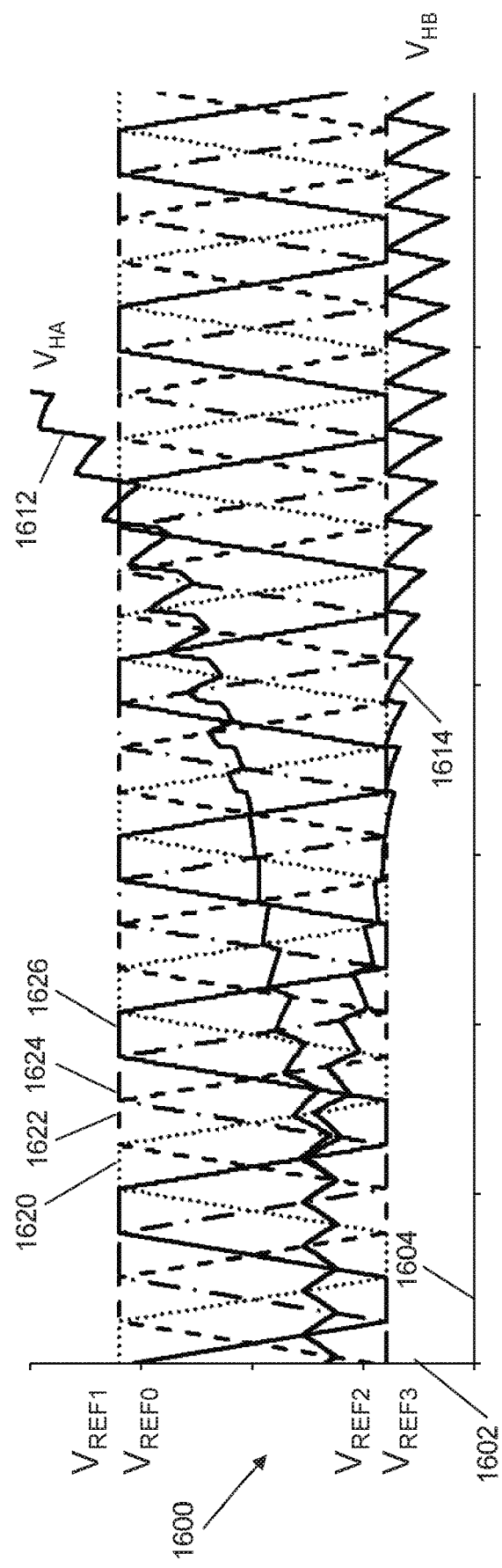
FIGS. 16a, 16b and 16c show an example embodiment of charts of voltage signals in the 3-level Class-D amplifier of FIG. 15.
Figure 16B:
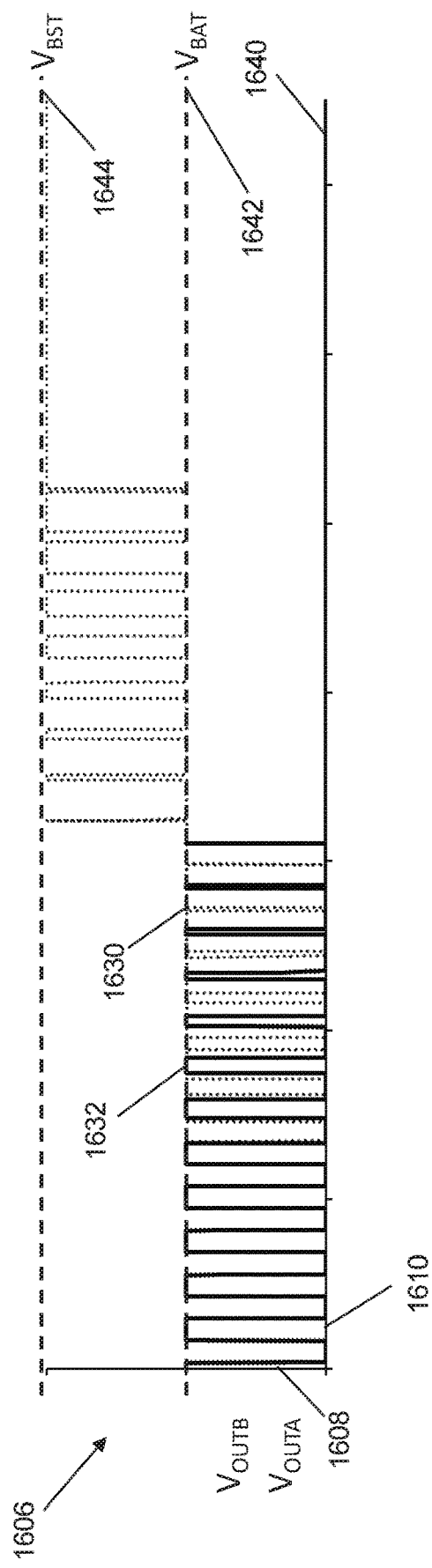
Figure 16C:
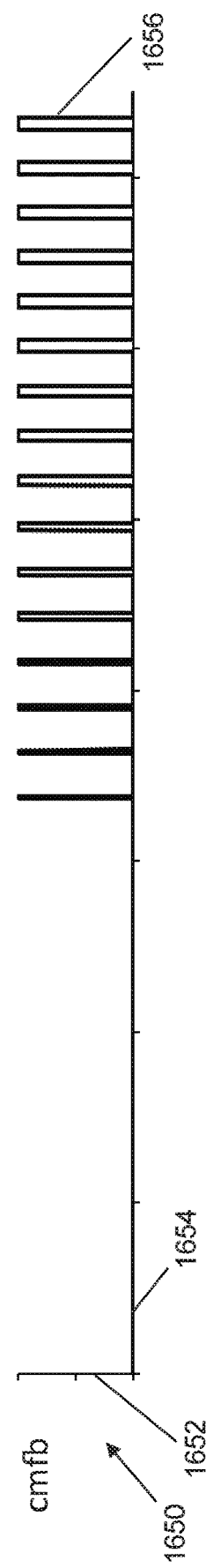

FIGS. 16*a*, 16*b* and 16*c* show two charts 1600, 1602, of signals generated by the circuit shown in FIG. 15, that are similar to the charts shown in FIG. 13 and similar features have therefore been given similar reference numerals and may not necessarily be discussed further here.

FIGS. 16*a*, 16*b* and 16*c* show the loop integrator outputs VHA 1612 and VHB 1614, the reference trapezoids VREF0 1620, VREF1 1622, VREF2 1624 and VREF3 1626, the output signals VOUTA 1630 and VOUTB 1630. FIGS. 16*a*, 16*b* and 16*c* also show a third chart 1650, with voltage on a vertical axis 1652 and time on a horizontal axis 1654, that plots the common-mode feedback signal (cmfb) 1656, discussed above in relation to FIG. 15. The charts 1600, 1606, 1650 shown in FIG. 16 all relate to a simulation where the input signal VIN (not shown) is ramped up from zero to full-scale with the common-mode feedback control active. As can be seen, the common-mode feedback signal (cmfb) 1656 becomes active at the moment integrator output VHB 1614 runs out of range and forces VHB 1614 to cross the bottom of the trapezoidal references 1620, 1622, 1624, 1626 each period. That is, the integrator output signal VHB 1614 enters region '0', that is below the low-value of the trapezoidal reference signals 1620, 1622, 1624, 1626.

The moment that integrator output VHB 1614 falls below the bottom range of the trapezoidal references 1620, 1622, 1624, 1626 can be detected by using logical equation (4) presented above. If equation (4) is true at the rising edge of the clock signal then integrator output VHB 1614 is below range and a feedback-control-signal (cmfb) 1656 is generated by the combinatorial logic block coupled to the comparators, after a suitable time interval as described above in relation to FIG. 15. Further divergence of the integrator output VHB 1614 can be prevented by sinking an additional current from the virtual ground node of the integrator. This causes integrator output VHB 1614 to increase. When the integrator output VHB 1614 increase such that it crosses the bottom flat part of any of the trapezoidal reference signals 1620, 1622, 1624, 1626, the additional current can be switched off again. If at the same time, the same current is sunk from the virtual ground node of the integrator that generates output VHA 1612, then the additional injected current becomes a common-mode current. This means that the differential mode transfer of the system will not be affected: the missing part of the signal is simply added to the opposite bridge-half.

Therefore, the uncontrolled divergence of integrator output VHB 1614 is prevented. Furthermore, comparing to the situation shown in FIG. 13, it can be seen that the integrator output VHA 1612 now increases faster when the common-mode feedback engages and even rises above the top range of the trapezoidal references 1620, 1622, 1624, 1626 causing VOUTA 1630 to be permanently switched to VBST 1644.

Figure 17A:
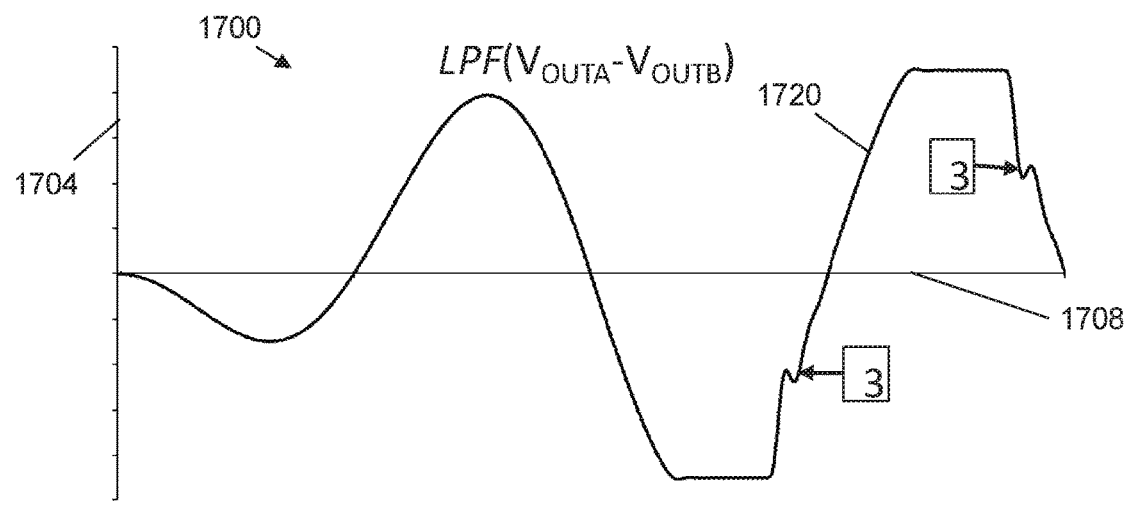
FIGS. 17a and 17b show an example embodiment of charts that illustrate problems in the output voltages of the 3-level Class-D amplifier of FIG. 15.
Figure 17B:
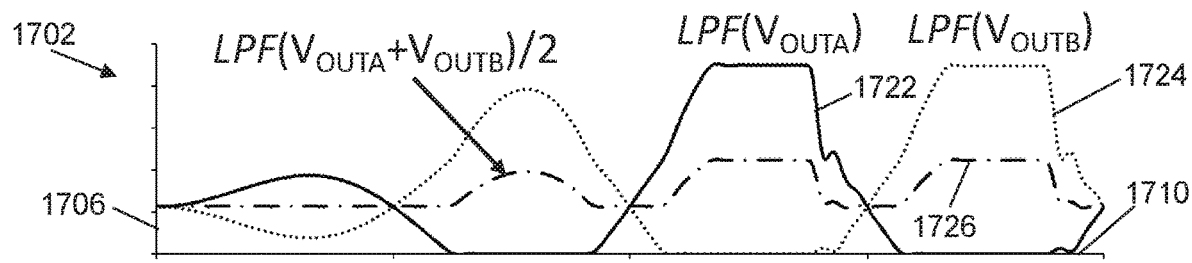

FIGS. 17a and 17b show charts 1700, 1702, of signals generated by the circuit shown in FIGS. 16a, 16b and 16c, that illustrates the effect of common-mode feedback on the low-pass filtered output signals. FIGS. 17a and 17b are similar to FIGS. 14a and 14b and similar features have been given similar reference numerals and may not be discussed further here. A sinewave with increasing amplitude is used as input signal (not shown). The second chart 1702 clearly shows a kink in VOUTB 1724 when VOUTA 1722 bottoms out at ground and vice versa. The resulting differential mode signal, shown in the first chart 1700, shows no distortion as long as the power output does not clip against the VBST supply rail. Also the recovery from the bridge-half that is clipping to ground is very smooth without 'sticking' and settle response. However, when the signal level increases in the right hand side of FIGS. 17a and 17b, the amplifier output clips to the supply rail and shows again 'sticking' and settle response in the clip recovery at the moments marked with '3'. This is the result of the uncontrolled divergence of integrator output VHA above the trapezoidal reference signals. A solution to this problem, that is similar to the common-mode control approach described above, will be described below.

Figure 18:
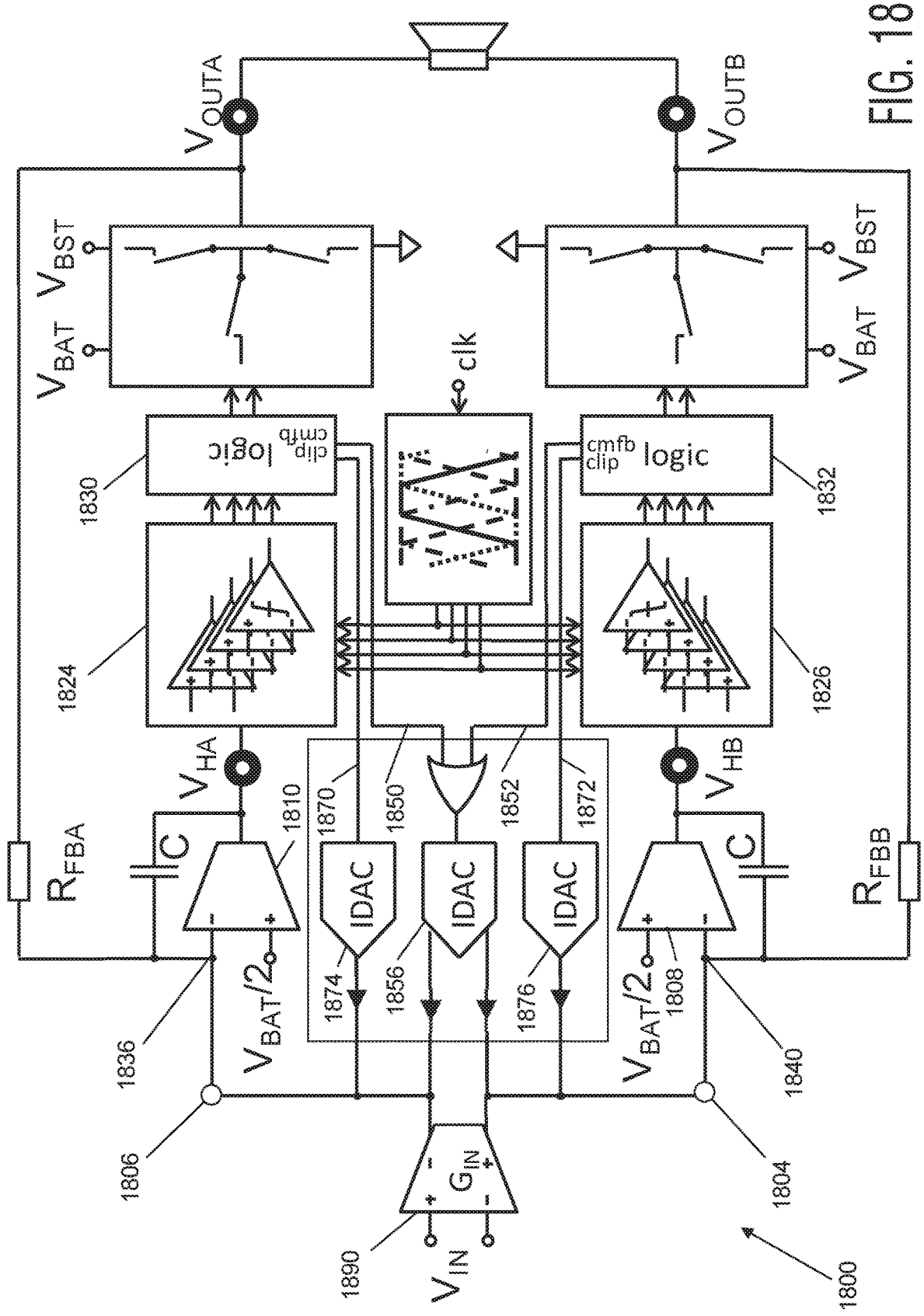
FIG. 18 shows an example embodiment of a 3-level Class-D amplifier, similar to that shown in FIG. 15, with an input-control-circuit for performing clipping control.

FIG. 18 shows a 3-level PWM feedback loop circuit 1800, similar to that shown in FIG. 15, similar features have been given similar reference numerals and may not necessarily be discussed further here. The circuit 1800 has combinatorial logic blocks 1830, 1832 for both bridge-halves which both produce a clip signal 1870, 1872. A clip signal 1870, 1872 is an example of a feedback-control-signal, which is determined based on a comparison-signal. In this example, the logic blocks 1830, 1832 also produce a common-mode-feedback signal 1850, 1852 as described above.

The clip signal 1870, 1872 is fed to a one-bit current DAC 1874, 1876 associated with the same bridge-half as the logic block 1830, 1832 that produced the clip signal 1870, 1872. The two one-bit current DACs 1874, 1876 are both components of an input-control-circuit. Both of the one-bit current DACs 1874, 1876 are examples of a current-pulse-block which can also be called a single-ended-current-pulse-block. If the integrator output of either bridge-half rises above the high-value of any trapezoidal reference, then the associated one-bit current DAC 1874, 1876 will act as a current source. This can prevent, or reduce the likelihood of, the respective integrator 1808, 1810 diverging by sourcing current from the input-terminal 1804 or the second-input-terminal 1806, as required, until the integrator output VHA or VHB decreases to, or crosses, the high-signal-portion of one of the trapezoidal reference signals. The current source can be provided as a current pulse, which can be described as a single-ended-current-pulse. The current source provides an example of a pulse that is configured to subtract from the input-signal.

The moment that integrator output VHA rises above the top range of the trapezoidal references can be easily detected by using logical equation (5). If equation (5) is true at the rising edge of the clock signal then the integrator output VHA is above range and a clip signal 1870 is generated by the combinatorial logic 1830. Further divergence of the integrator output VHA can be prevented by sourcing an additional current from the virtual ground node 1836 of the integrator VHA 1810. This causes the integrator output VHA to decrease. When VHA drops back into range of the trapezoidal reference signals by crossing the top flat part of a trapezoidal reference, the clip signal 1870, 1872 is unset such that the additional current can be switched off again. Contrary to the common-mode feedback, this additional current is not common-mode: no matching current is sourced from the virtual ground node 1840 of the opposite integrator VHB 1808.

Figure 19A:
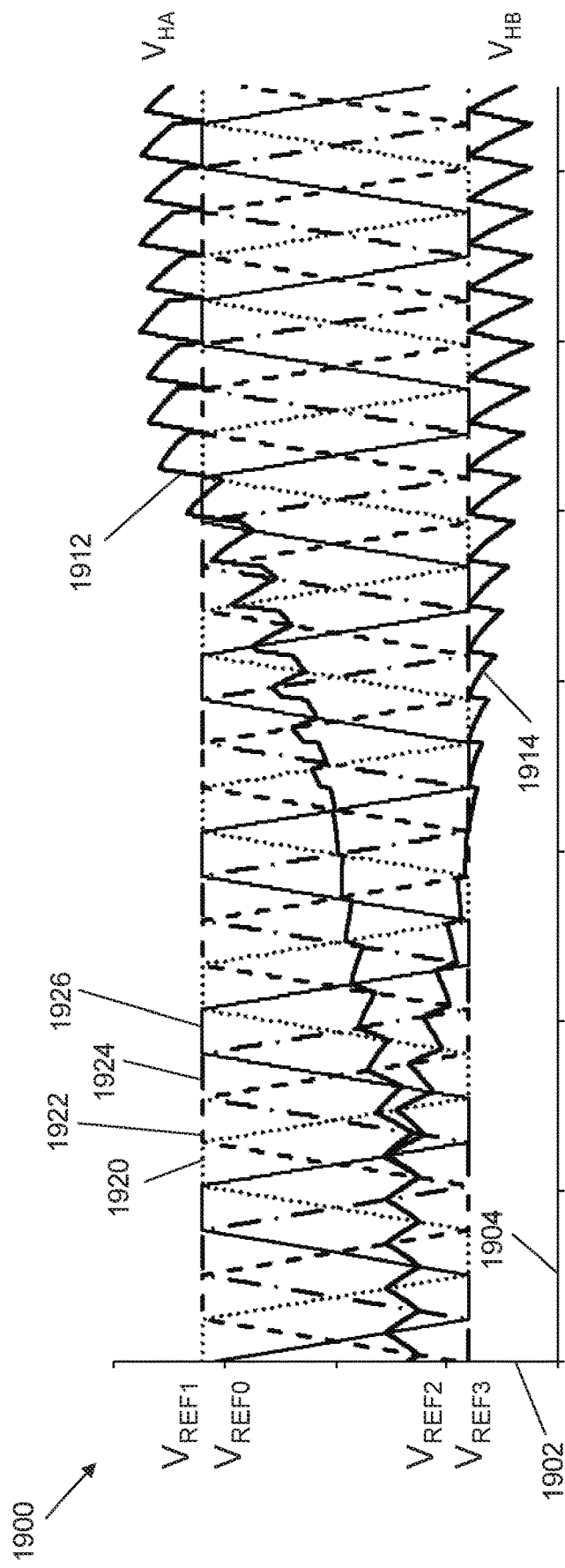
FIGS. 19a, 19b and 19c show an example embodiment of charts of voltage signals in the 3-level Class-D amplifier of FIG. 18.
Figure 19B:
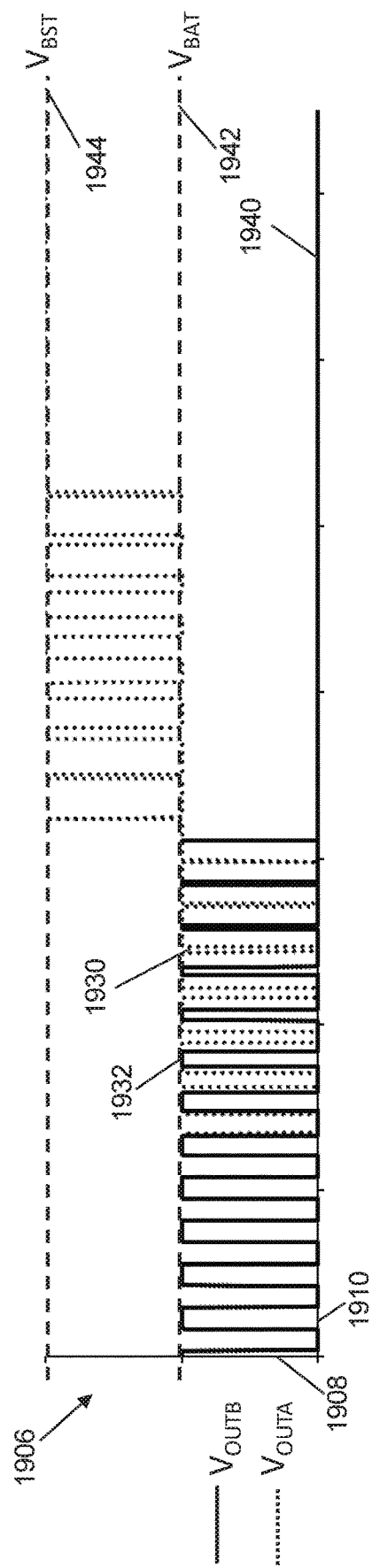
Figure 19C:
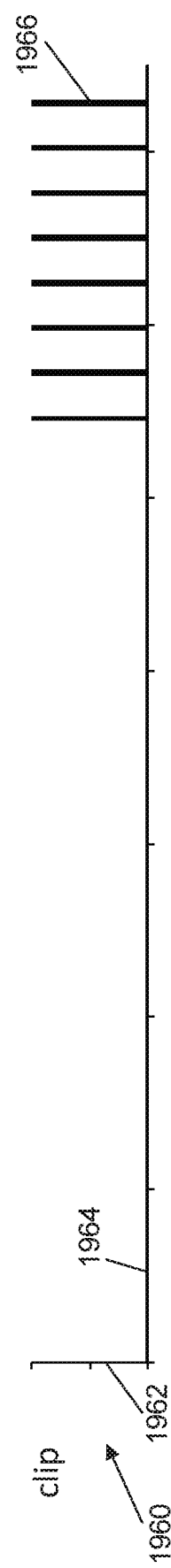

FIGS. 19a, 19b and 19c show charts, of signals generated by the circuit shown in FIG. 18, that are similar to those shown in FIGS. 16a, 16b and 16c and similar features have been given similar reference numerals and may not necessarily be described further here. A first chart 1900 shows the loop integrator outputs VHA 1912 and VHB 1914, and the reference trapezoids VREF0 1920, VREF1 1922, VREF2 1924 and VREF3 1926. A second chart 1906 shows the output signals VOUTA 1930 and VOUTB 1932. A third chart 1960 shows the clip signal 1966. All three charts 1900, 1906, 1960 relate to a simulation where the input signal VIN (not shown) is ramped up from zero to full-scale with both common-mode feedback and clip recovery control active. As can be seen the clip signal becomes active at the moment integrator output VHA 1912 runs out of range, which forces the integrator output VHA 1912 to touch the top of the trapezoidal references each period, halting the uncontrolled divergence of integrator output VHA 1912.

Figure 20A:
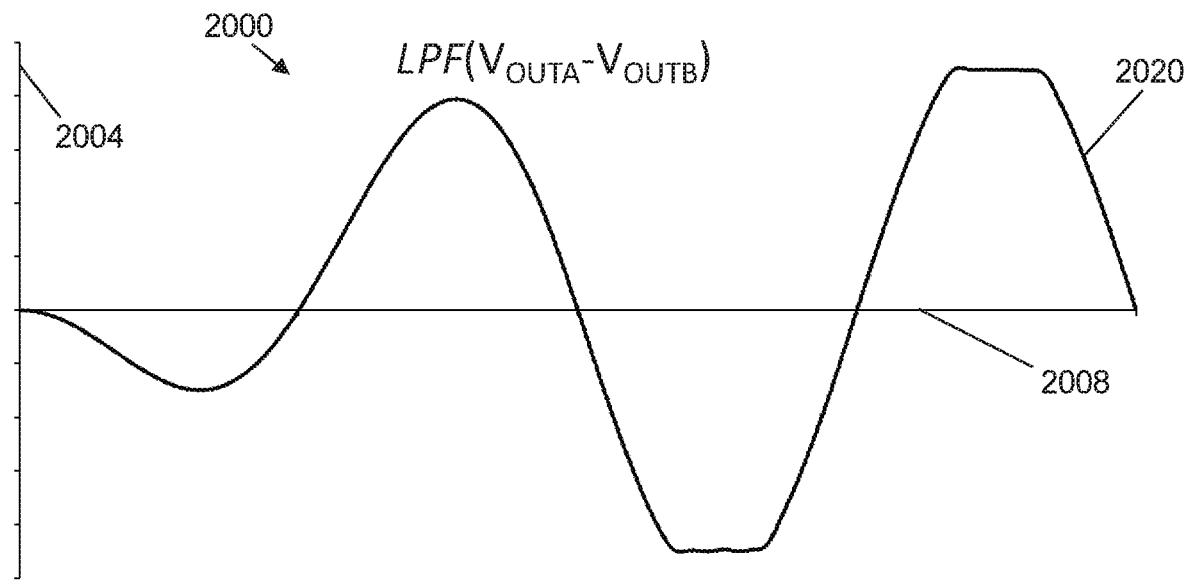
FIGS. 20a and 20b show an example embodiment of charts that illustrate advantageous performance of the output voltages of the 3-level Class-D amplifier of FIG. 18.
Figure 20B:
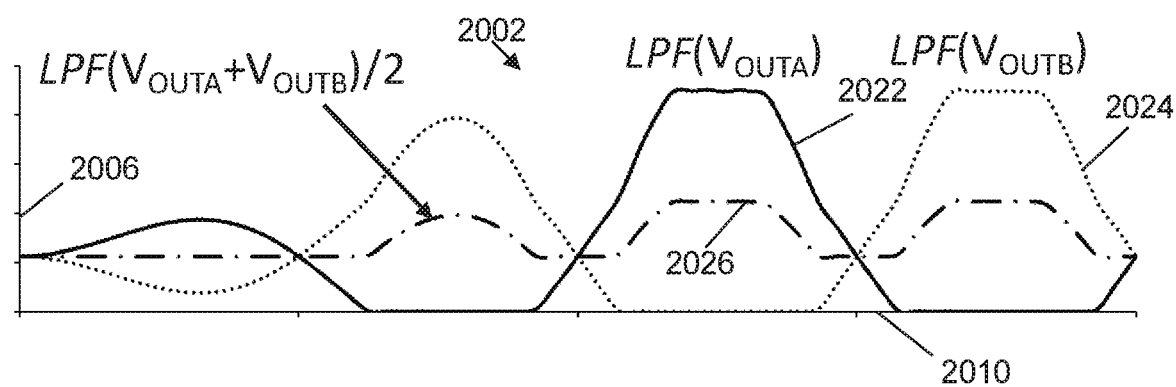

FIGS. 20a and 20b show a chart, of the output signal generated by the circuit of FIG. 18, that illustrates the effect of clip recovery control on the low-pass filtered output signals. FIG. 20 is similar to FIGS. 14a, 14b and FIGS. 17a and 17b, and similar features have been given similar reference numerals and may not be discussed further here. The output signals shown in FIGS. 20a and 20b were generated based on a sinewave with increasing amplitude used as an input signal (not shown). As can be seen from the first chart 2000, the differential signal 2020 shows that the recovery from clipping is smooth and without 'sticking' or settle responses shown in FIGS. 14 and 17.

Figure 21:
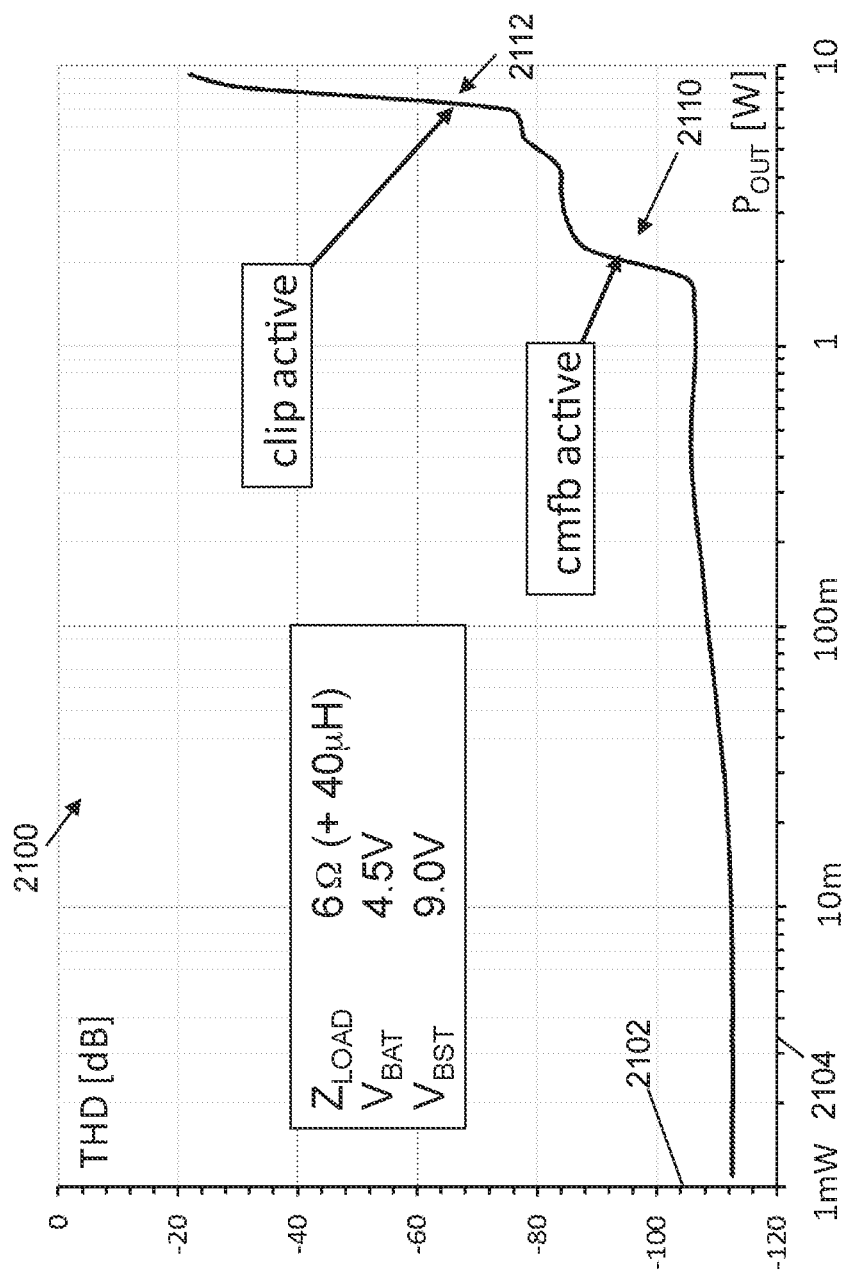
FIG. 21 shows an example embodiment of a chart showing simulation results of the total harmonic distortion as a function of power output for the 3-level Class-D amplifier of FIG. 18.

FIG. 21 shows a plot 2100 of the total harmonic distortion (THD) on a vertical axis 2102 as a function of output power, on a horizontal axis 2104, for Class-D amplifier shown in FIG. 18 supplying a 6Ω+40 μH load. For this simulation a 3rd order loop filter was used. At low signal levels the THD is well below −100 dB. At around 1.6 W, a sharp increase 2110 of about 20 dB can be seen when the common-mode feedback becomes active and one of the single-ended bridge halves starts to clip to ground. This matches the maximum undistorted output power that can be obtained in a 6Ω load and a battery voltage VBAT of 4.5V: $P_{OUT}=V^2/2 \times R_{LOAD}=(4.5)^2/(2 \times 6)=1.69$ W. The second sharp increase 2112 at about 6.5 W corresponds to the moment the opposite bridge half clips to the supply boosted supply $V_{BST}$ of 9V: $P_{OUT}=(9.0)^2/(2 \times 6)=6.75$ W.

The simulation results shown in the plot 2100 demonstrate that the injection of common-mode currents into the virtual ground nodes of the PWM feedback loop causes only a modest increase in distortion.

Some elements used in the PWM feedback loop shown in FIG. 18 are standard components. The Operational Transconductance Amplifier's comparators 1824, 1826 have no special requirements and the current DACs 1856, 1874, 1876 are essentially switchable current sources.

The input stage 1890 of the PWM feedback loop circuit 1800 is a linear V/I converter. In other examples the input stage 1890 could be a current-steering D-to-A converter (not shown). Both one-bit and multi-bit converters could be used for the input stage 1890.

An important non-standard element in this disclosure is the generation of the trapezoidal reference waveforms. It is advantageous that these waveforms can be synchronized to an external clock source (clk). Also the slopes of the trapezoidal waveform should preferably be linear and traverse between two well defined boundary levels $V_{MAX}$ and $V_{MIN}$.

Figure 22:
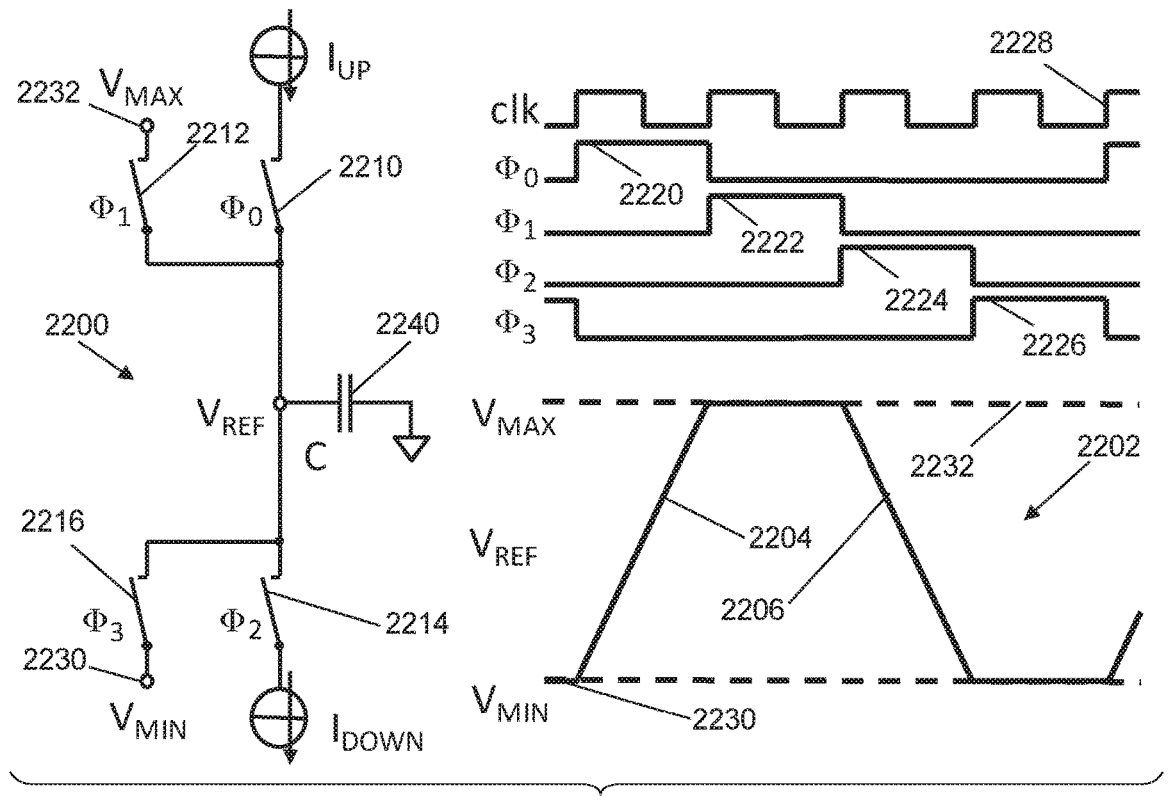
FIG. 22 shows an example embodiment of a circuit for generating a trapezoidal reference signal.

FIG. 22 shows a schematic diagram of a circuit 2200 that can produce a trapezoidal waveform $V_{REF}$ 2202. The circuit 2200 has four switches 2210, 2212, 2214, 2216 that are controlled by four clock phases $\Phi_0$ 2220, $\Phi_1$ 2222, $\Phi_2$ 2224 and $\Phi_3$ 2226 that are derived from a master clock signal (clk) 2228. Initially the output voltage $V_{REF}$ is connected to lower boundary $V_{MIN}$ 2230 through switch $\Phi_3$ 2216. At the first rising edge of clk 2228, switch $\Phi_3$ 2216 is opened and switch $\Phi_0$ 2210 is closed. In this phase, capacitor C 2240 is charged with a constant current $I_{UP}$ resulting in a linear rising transition 2204. $V_{REF}$ 2202 reaches the upper boundary $V_{MAX}$ 2230 at the second rising edge of clk 2228. At this instant switch $\Phi_0$ 2210 is opened and switch $\Phi_1$ 2212 is closed connecting $V_{REF}$ 2202 to $V_{MAX}$ 2230. At the third rising edge of clk 2228, switch $\Phi_1$ 2212 is opened and switch $\Phi_2$ 2214 is closed. In this phase, the capacitor C 2240 is discharged with a constant current $I_{DOWN}$ resulting in a linear falling transition 2206 of $V_{REF}$ 2202. $V_{REF}$ 2202 reaches the lower boundary $V_{MIN}$ 2230 at the fourth rising edge of clk 2228. At this instant switch $\Phi_2$ 2214 is opened, switch $\Phi_3$ 2216 is closed connecting $V_{REF}$ 2202 to $V_{MIN}$ 2230 and the cycle is completed.

This scheme will work smoothly if the linear transitions 2204, 2206 have exactly the right slope to cause $V_{REF}$ 2202 to go from $V_{MIN}$ 2230 to $V_{MAX}$ 2232 or back in one clock cycle. Therefore, regulation of the currents $I_{UP}$ and $I_{DOWN}$ can be advantageous.

Figure 23:
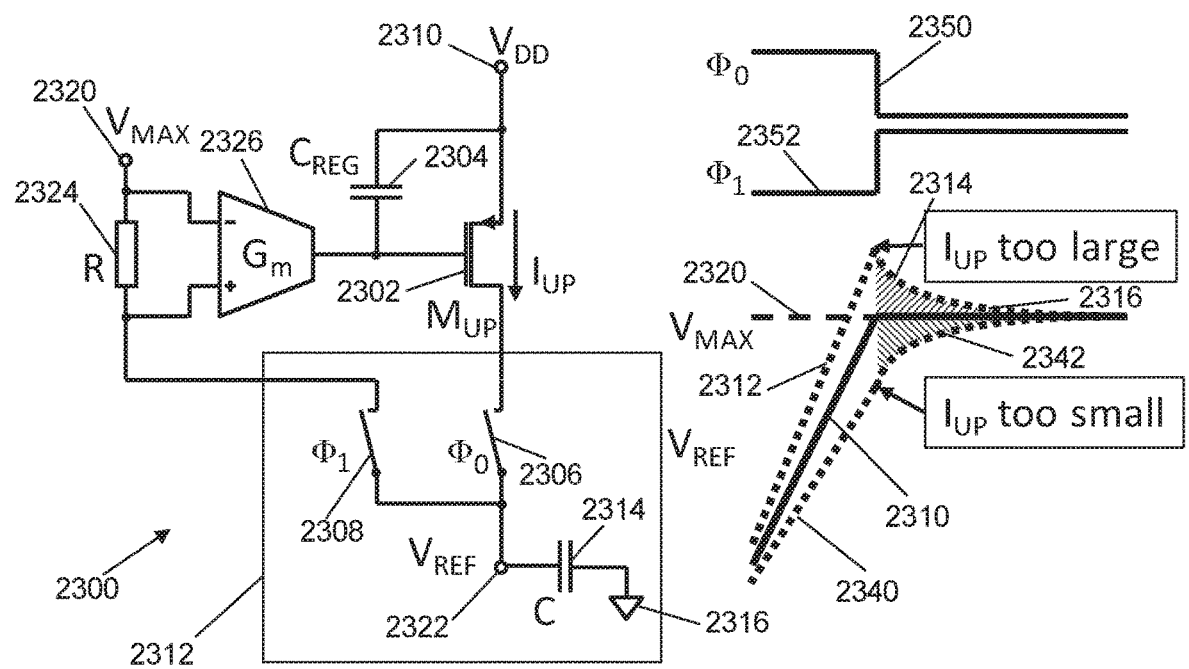
FIG. 23 shows an example embodiment of a self-regulating circuit for generating a trapezoidal reference signal.

FIG. 23 shows a schematic diagram of a circuit 2300 for regulation of $I_{UP}$. The current source is provided by a PMOS transistor $M_{UP}$ 2302 and the value of the current $I_{UP}$ is controlled by the voltage on the gate of $M_{UP}$ 2302 that is stored on a capacitor $C_{REG}$ 2304. If $I_{UP}$ has exactly the correct value, the voltage $V_{REF}$ 2310 will be exactly at $V_{MAX}$ 2320 when the clock signal causes switch $\Phi_0$ 2306 to be opened (by a first control signal 2350) and switch $\Phi_1$ 2308 to be closed (by a second control signal 2352).

If $I_{UP}$ is too large then a high voltage $V_{REF}$ high 2312 will overshoot $V_{MAX}$ 2320 at that time. When $\Phi_1$ 2308 is closed it connects node $V_{REF}$ 2322 to $V_{MAX}$ 2320 through a resistor R 2324, which pulls $V_{REF\ high}$ 2312 to $V_{MAX}$ 2320 with an exponential relaxation curve 2314 with a time constant equal to RC. Preferably, the time constant should be much smaller than the clock period of clk to allow $V_{REF\ high}$ 2312 to get close enough to $V_{MAX}$ 2320 in that time. During this relaxation 2314 a transconductance $G_m$ 2326, which is an example of a voltage to current converter, will inject a charge proportional to the higher shaded area 2316 on $C_{REG}$ 2304, causing the gate voltage of $M_{UP}$ 2302 to increase and the current $I_{UP}$ to decrease towards the desired value $V_{MAX}$ 2320.

If $I_{UP}$ is too small then a voltage $V_{REF\ low}$ 2340 will not reach $V_{MAX}$ 2320 in time. In this case $V_{REF\ low}$ 2340 will be pulled towards $V_{MAX}$ 2320 through resistor R 2324 and a charge proportional to the lower shaded area 2342 will be taken from $C_{REG}$ 2304, causing the gate voltage of the transistor $M_{UP}$ 2302 to decrease and current $I_{UP}$ to increase towards the desired value $V_{MAX}$ 2320.

The circuit 2300 is an example of a current regulation circuit. The circuit 2300 has a first switching module that includes: a reference-capacitor 2314 with a first plate connected to a ground-terminal 2316 and a second plate connected to the first-reference-signal terminal 2322. The ground-terminal 2316 may be connected to earth or to a floating ground, or to any DC voltage. The first switching module 2312 also has a first-target-level switch 2306 connected to the first-reference-signal terminal 2322, and a second-target-level switch 2308 connected between the first-reference-signal terminal 2322 and a target-voltage-terminal 2320 configured to supply a target-voltage level, which in this example is a high-level $V_{MAX}$ but which in other examples could be a low-level. The circuit has a target current regulation transistor 2302 with a first conduction channel terminal and a second conduction channel terminal connected to a voltage source terminal 2310. The first-target-level switch 2306 is connected between the first-reference-signal terminal 2322 and the first conduction channel terminal. The circuit has a resistor 2324 connected between the target-voltage terminal 2320 and the second-target-level switch 2308. The circuit 2300 has a voltage-to-current-converter 2326 with differential input terminals connected across the resistor 2324. The voltage-to-current-converter 2326 has an output terminal connected to a control terminal of the target current regulation transistor 2302. The circuit has a regulation capacitor 2304 with a first plate connected to the control terminal and a second plate connected to the voltage source 2310. When the first switch-target-level 2306 is closed and the second-target-level switch 2308 is open, the circuit 2300 is configured to supply a charging current to the reference capacitor 2314 to set a voltage across the reference capacitor at a charged-voltage-level. When the first-target-level switch 2306 is open and the second-target-level switch 2308 is closed, the circuit 2300 is configured to supply an adjustment current to the reference capacitor 2314 if the charged-voltage-level does not equal the target-voltage-level, such that the voltage across the reference capacitor 2314 converges towards the target-voltage-level.

For regulation of $I_{DOWN}$ a complementary version (not shown) of the circuit 2300 can be used. Since the voltage $V_{REF}$ is pulled towards $V_{MAX}$ or $V_{MIN}$ in the appropriate phases the starting point for each transition is always the same thus avoiding, or reducing the likelihood of, potential cross-regulation problems between the $I_{UP}$ and $I_{DOWN}$ regulation loops.

In different embodiments, the target-voltage level can be either a top-level (such as VMAX) or a bottom-level (such as VMIN). When the target-voltage level is a top-level and the circuit 2300 can be extended to include additional components (which are not shown in FIG. 23, although some such additional components are shown in FIG. 24).

An extended circuit can include a bottom current regulation transistor with a first conduction channel terminal and a second conduction channel terminal connected to a second voltage source terminal; a bottom-resistor connected to a bottom-voltage terminal configured to supply a bottom-voltage level; a bottom voltage-to-current-converter with differential input terminals connected across the bottom resistor, wherein the bottom voltage-to-current-converter has an output terminal connected to a control terminal of the bottom current regulation transistor; a bottom regulation capacitor with a first plate connected to the control terminal and a second plate connected to the second voltage source. The first switching module in an extended circuit can also have a first-bottom-level switch connected between the first-reference-signal terminal and the first conduction channel terminal of the bottom current regulation transistor; a second-bottom-level switch connected between the first-reference-signal terminal and the bottom-voltage-terminal such that the bottom resistor is connected between the bottom-voltage-terminal and the second-bottom-level switch. When the first-bottom-level switch is closed and the second-bottom-level switch is open, the voltage reference circuit is configured to supply a charging current to the reference capacitor to set a voltage across the reference capacitor at a bottom-charged-voltage-level. When the first-bottom-level switch is open and the second-bottom-level switch is closed, the voltage reference circuit is configured to supply an adjustment current to the reference capacitor if the charged-voltage-level does not equal the bottom-voltage-level, such that the voltage across the reference capacitor converges towards the bottom-voltage-level. In this way, an extended circuit can be configured to generate a first trapezoidal reference signal at the first-reference-signal terminal.

Figure 24:
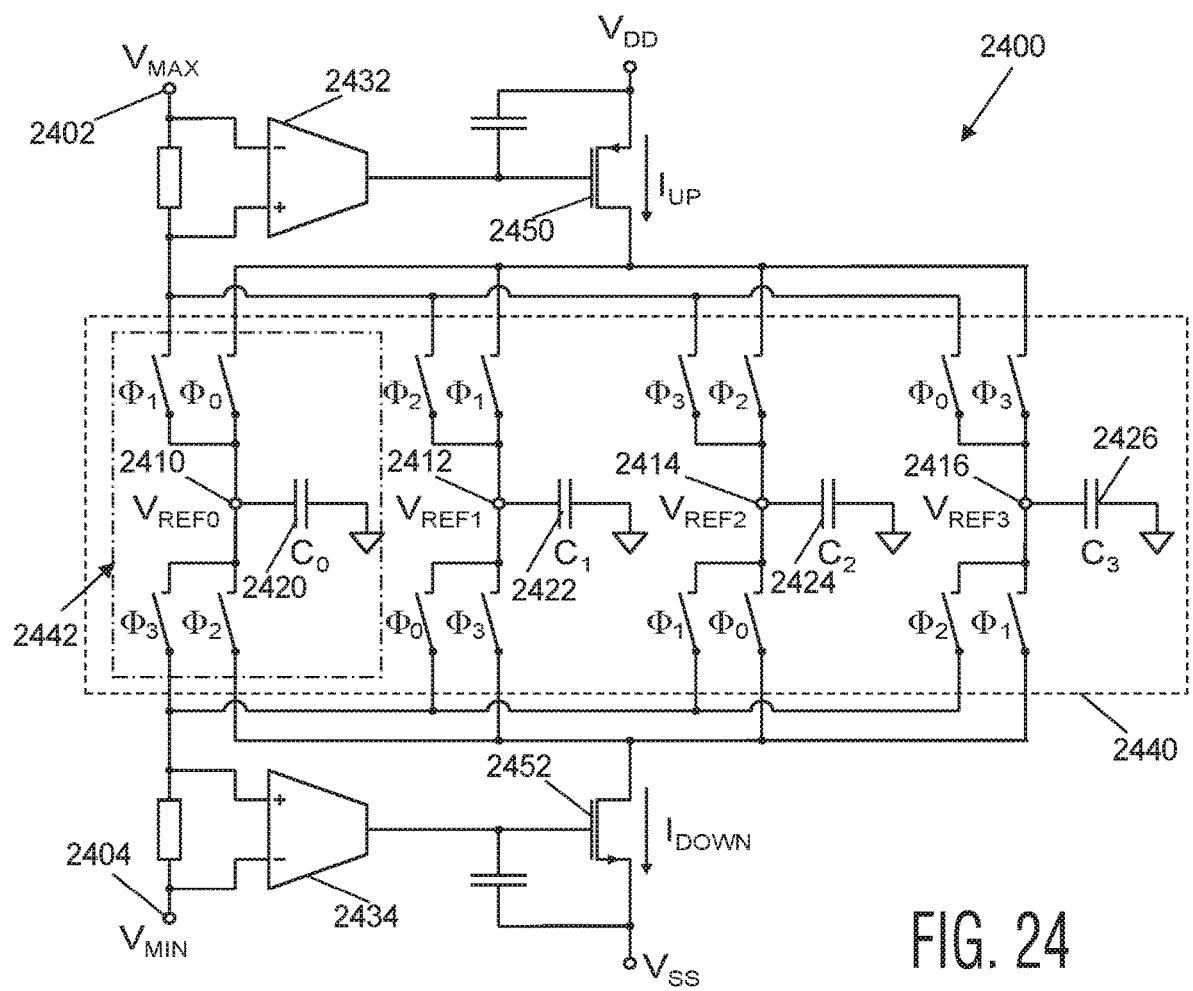
FIG. 24 shows an example embodiment of a circuit for generating four trapezoidal reference signals suitable for dividing a voltage space into five different regions.

FIG. 24 shows a schematic diagram of a circuit 2400 configured to generate four trapezoidal reference signals, with different phases, at each of four nodes 2410, 2412, 2414, 2416. In this circuit 2400 there will be at any time one of the nodes 2410, 2412, 2414, 2416 connected to $V_{MAX}$ 2402, one of the nodes 2410, 2412, 2414, 2416 connected to $V_{MIN}$ 2404, one of the nodes 2410, 2412, 2414, 2416 in a linear rising transition and one of the nodes 2410, 2412, 2414, 2416 in a linear falling transition.

An important advantage of this circuit 2400 is that it is very robust with respect to any mismatch in the values of the four regulation capacitors 2420, 2422, 2424, 2426.

The circuit 2400 can be considered to have a plurality of switching modules 2440 (including a first switching module 2440) with a plurality of reference-signal terminals 2410, 2412, 2414, 2416 (including the first-reference-signal terminal 2410).

In this example, the target-voltage level is a top-level. Each of the switching modules has: a respective reference-capacitor 2420, 2422, 2424, 2426 with a first plate connected to a ground-terminal and a second plate connected to a respective one of the reference-signal terminals 2410, 2412, 2414, 2416. Each of the switching module has a first target-level switch connected between the respective reference-signal terminal 2410, 2412, 2414, 2416 and the first conduction channel terminal of the target current regulation transistor 2450. Each of the switching modules has a second target-level switch connected between the respective reference-signal terminal 2410, 2412, 2414, 2416 and the target-voltage-terminal 2402. Each of the switching modules has a first bottom-level switch connected between the respective reference-signal terminal 2410, 2412, 2414, 2416 and the first conduction channel terminal of the bottom current regulation transistor 2452. Each of the switching modules has a second bottom-level switch connected between the respective reference-signal terminal 2410, 2412, 2414, 2416 and the bottom-voltage-terminal 2404.

The circuit 2400 is configured to generate a plurality of different trapezoidal reference signals and to supply a respective one of the plurality of different trapezoidal references signals to a respective one of the plurality of reference-signal terminals 2410, 2412, 2414, 2416.

In this example, the circuit 2400 is configured to generate four different trapezoidal reference signals comprising a first-reference-signal, a second-reference-signal, a third-reference-signal and a fourth-reference-signal. The second-reference-signal is phase shifted, with respect to the first-reference-signal, by one quarter of the period of the first-reference-signal. The third-reference-signal is phase shifted, with respect to the first-reference-signal, by one half of the period. The fourth-reference-signal is phase shifted, with respect to the first-reference-signal, by three quarters of the period. Therefore, the circuit 2400 is configured to generate trapezoidal reference signals such as those discussed above in relation to FIG. 11.

Figure 25:
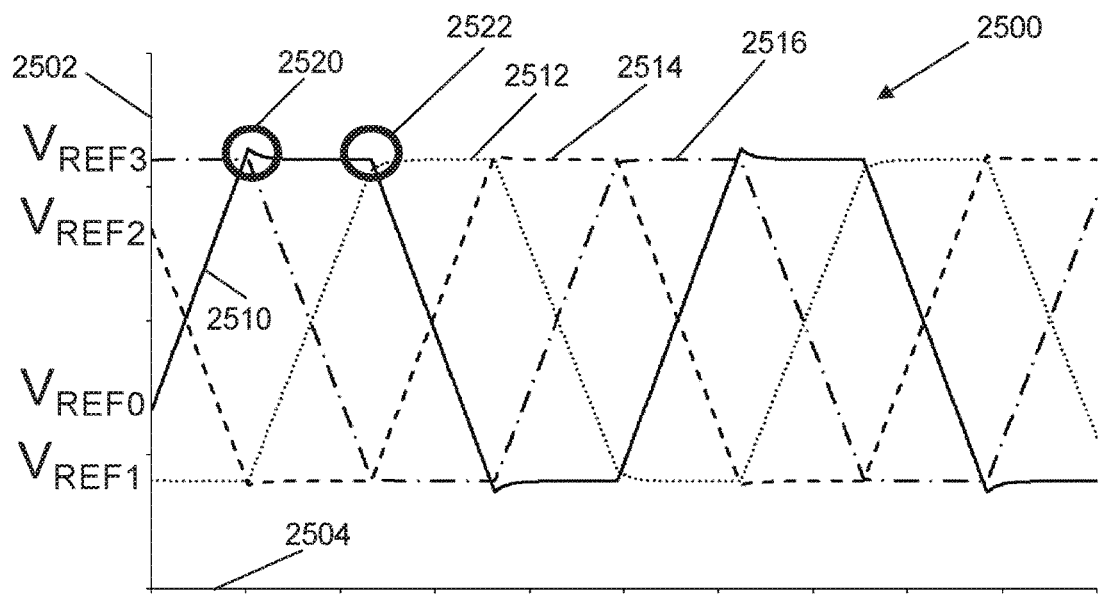
FIG. 25 shows an example embodiment of reference signals generated by the circuit of FIG. 24 when capacitor mismatch is present in the circuit.

FIG. 25 shows a chart 2500 of simulation results that simulate a 2% mismatch between the capacitor values of the regulation capacitors shown in FIG. 24. The chart 2500 shows voltage on a vertical axis 2502 and time on a horizontal axis 2504. The chart 2500 shows four trapezoidal reference signals $V_{REF0}$ 2510, $V_{REF1}$ 2512, $V_{REF2}$ 2514 and $V_{REF3}$ 2516. As can be seen in this case $V_{REF0}$ 2510 rises and falls too fast and shows a small overshoot 2520 and $V_{REF1}$ 2512 rises and falls too slowly and does not quite reach the target as a small undershoot 2522 occurs. However, the average of the four trapezoids $V_{REF0}$ 2510, $V_{REF1}$ 2512, $V_{REF2}$ 2514 and $V_{REF3}$ 2516 is regulated correctly and the occurrence of small overshoots 2520 and undershoots 2522 does not significantly hamper the operation of the common-mode feedback and clip recovery control.

Figure 26:
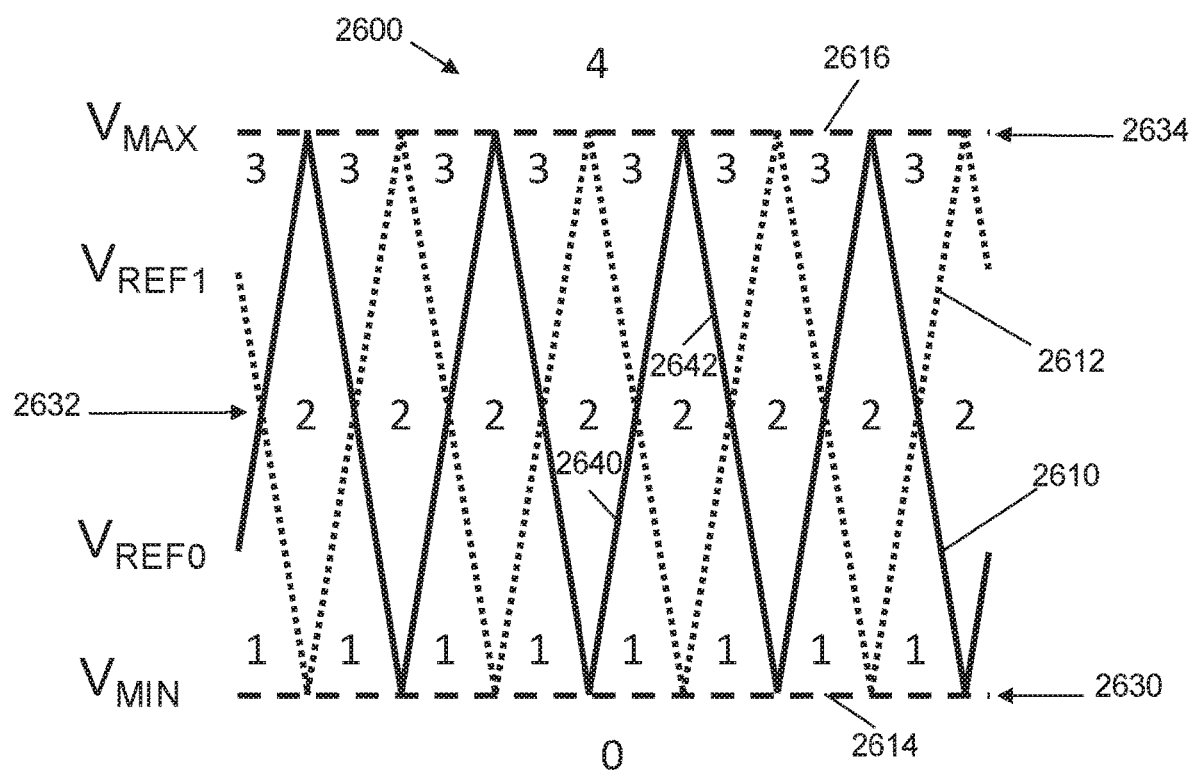
FIG. 26 shows an example embodiment of an alternative set of four reference signals that can divide a voltage space into five different regions.

FIG. 26 shows an alternative set of reference signals 2600 that can be used to implement the common-mode feedback and clip recovery control discussed above, instead of using four phase-shifted trapezoidal reference waveforms. The set of reference signals 2600 includes two phase-shifted triangular signals 2610, 2612 and two DC limit values $V_{MIN}$ 2614 and $V_{MAX}$ 2616. In some examples, one of the two DC limit values $V_{MIN}$ 2614 and $V_{MAX}$ 2616 can be considered optional.

The first triangular signal 2610 can also be called a first-reference-signal. The first triangular signal 2610 has a rising-signal-portion 2640 that rises from a bottom-level 2630 via a midpoint-level 2632 to a top-level 2634, and a falling-signal-portion 2642 that falls from the top-level 2634 via the midpoint-level 2632 to the bottom-level 2630. Since the first triangular signal 2610 is periodic, the above described signal behaviour is then repeated.

The second triangular signal 2612, which is an example of a fourth-reference-signal, is an inverted, or phase shifted, copy of the first triangular signal 2610. Since both signals 2610, 2612 are triangular, a phase shift of half a period is equivalent to inversion.

The DC limit value $V_{MIN}$ 2614 can be referred to as a second-reference-signal, which consists of a low-signal-portion that is repeated every clock cycle to represent the low-value that a feedback-voltage-signal should not fall below without triggering a common-mode-current-pulse. Similarly, the DC limit value $V_{MAX}$ 2616 can be referred to as a third-reference-signal, which consists of a high-signal-portion that is repeated every clock cycle to represent the high-value that a feedback-voltage-signal should not exceed without triggering a single-ended-current-pulse.

As can be seen, this alternative set of reference signals 2600 can also demarcate the same signal regions '0', '1', '2', '3', '4' as the trapezoidal signals shown in FIG. 11.

Therefore, the appropriate 3-level PWM signals can also be generated by suitable logic circuits configured to use the alternative set of reference signals 2600.

In some examples, a first-reference signal can be either a triangular signal or a trapezoidal signal, and the fourth-reference signal can be an inverted triangular signal or a phase shifted trapezoidal signal, respectively. The second-reference-signal or third-reference-signal can then be either a constant DC limit with a low value or a high value, or a third, or fourth, phase shifted trapezoidal signal, respectively. Of course, the third or fourth phase shifted trapezoidal signals will only represent the low value or the high value for different portions of their respective periods.

A circuit that can operate with both common-mode control and clipping recovery control can use four different reference signals to demarcate the five different signal zones/regions, as discussed above. However, in some examples, it is possible to have a circuit that is capable of performing only common-mode control or only clipping recovery control, in which case only three reference signals, such as the first triangular signal 2610, the second triangular signal 2612 and one of either the DC limit value $V_{MIN}$ 2614 or the DC limit value $V_{MAX}$ 2616 may be used.

Figure 27:
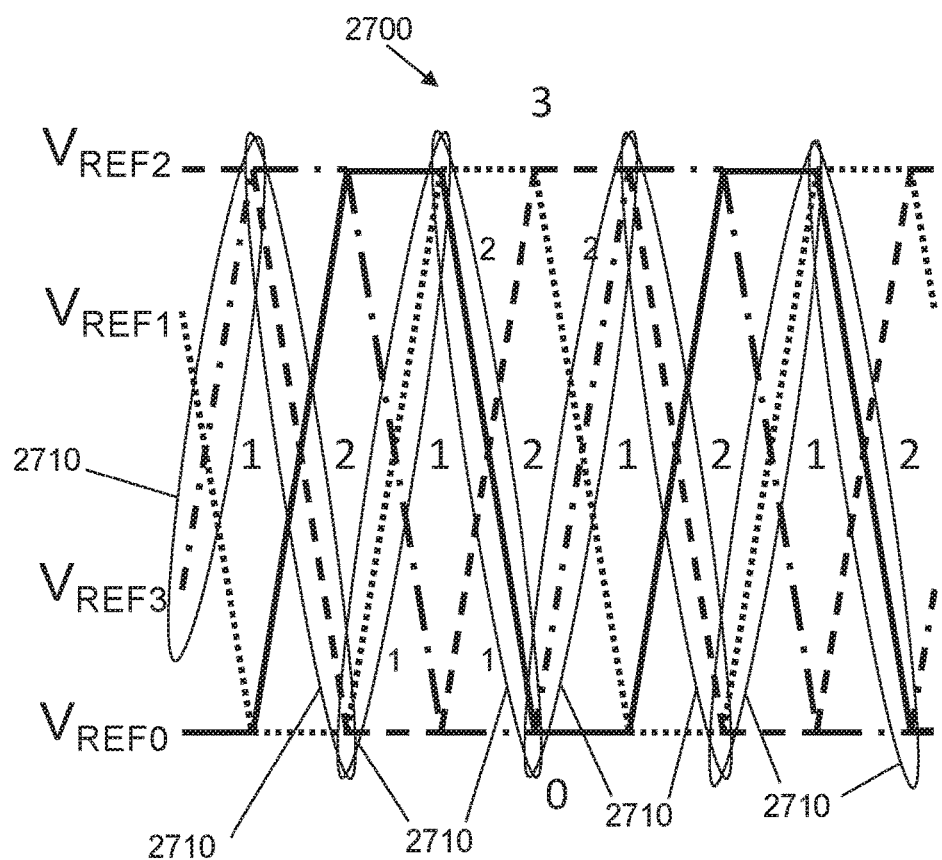
FIG. 27 shows an example embodiment of four trapezoidal reference signals configure to divide a voltage space into 4 different regions for controlling a 2-level Class-D amplifier with common-mode and clipping control.

FIG. 27 shows the same configuration of four trapezoidal reference signals 2700 shown in FIG. 11. FIG. 27 shows voltage on a vertical axis and time on a horizontal axis. As explained above in relation to FIG. 11, the trapezoidal reference signals 2700 can be used to generate 3-level PWM signals. However, FIG. 27 shows that the four trapezoidal reference signals 2700 can also be used to demarcate four different voltage regions that correspond to two PWM levels (marked as regions '1' and '2') plus two out-of-range levels (marked as regions '0' and '3'). The required logic needed to generate 2-level PWM signalling is simple but may not be strictly combinatorial anymore because some memory elements may be used to keep track of which of the trapezoidal slopes should be active or inactive for controlling the output voltage of a 2-level PMW circuit. In this example, ellipses 2710 have been drawn around the sloped portions of the trapezoidal reference signals used to control the output voltage, to highlight those portions. It can be seen that the reference signal portions that have been highlighted together form a triangular waveform, which consequently divides the locus within the range of the trapezoidal references into the two regions: region '1' below the highlighted portions and region '2' above the highlighted portions. The top-levels of the trapezoidal references demarcate the boundary of the high out-of-range region '3', while the bottom-levels of the trapezoidal references demarcate the boundary of the low out-of-range region '0'.

The resulting 2-level PWM control signal has a two times lower fundamental frequency but this can easily be adjusted by running the trapezoid reference generator at a two times higher frequency.

When a comparator-input-voltage signal crosses one of the highlighted portions 2710, a two-level PMW circuit can switch the output voltage between a high-level and a low-level such as ground. If the comparator-input-voltage crosses from region '1' to region '2' the circuit can switch the output voltage to the high-level, and if the comparator-input-voltage crosses from region '2' to region '1' then the circuit can switch the output voltage to the low-level.

An advantage of using the trapezoidal reference signals 2700, compared to the classical PWM method with a single triangle reference, is that the common-mode feedback and clip recovery control techniques described in this disclosure can also be used in a 2-level PMW circuit to reduce the total harmonic distortion of the output signal.

Embodiments disclosed herein can be considered advantageous over multi-level class-D amplifier that use two reference triangle signals of different amplitudes to regulate the common mode level at the output. Such common mode regulation would be essentially a feed forward control system and not a feedback control system as disclosed above. Furthermore, systems limited to two reference triangle signals may disadvantageously not be able to implement the recovery from clipping feedback control system disclosed above.

The idea of using multiple phase shifted reference signals in combination with logic to generate a multi-level PWM signal may be implemented efficiently with trapezoidal instead of only triangular reference signals. An important advantage of trapezoidal reference signals, or reference signals that can otherwise demarcate the range of low to high, is that common-mode regulation and/or clipping recovery control can readily be implemented. This can be beneficial over a multi-level class-D amplifier that can use two phase-shifted triangle reference signals at half the PWM frequency to address an alignment issue.

Systems for clipping recovery in a 2nd order class-D amplifier that use a pulsed current to prevent an integrator from diverging may, disadvantageously, not include common-mode regulation. However, common-mode regulation can be achieved by embodiments disclosed herein.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A circuit comprising:
an input terminal configured to receive an input-signal;
an output terminal configured to provide an output-signal;
a reference circuit comprising:
    a first output terminal configured to provide a first-reference-signal;
    a second output terminal configured to provide a second-reference-signal; and
    a third output terminal configured to provide a third-reference-signal,
    wherein:
        the first-reference-signal varies between a high-value and a low-value;
        the second-reference-signal is generated to demarcate signal levels below the low-value;
        the third-reference-signal is generated to demarcate signal levels above the high-value,
a comparator-block configured to compare a comparator-input-voltage-signal representative of the input-signal received at the input terminal with:
(i) the first-reference-signal,
(ii) the second-reference-signal and
(iii) the third-reference-signal in order to generate a comparison-signal;
a control-block configured to set the output-signal as one of at least two voltage levels based on the comparison-signal; and
an input-control-circuit configured to apply a feedback-control-signal to the input-terminal based on the comparison-signal.

2. The circuit of claim 1, wherein
the reference circuit comprises a fourth output terminal configured to provide a fourth-reference-signal that varies between the high-value and the low-value, and
the comparison signal is generated based on a comparison between the comparator-input-voltage-signal and the fourth-reference-signal.

3. The circuit of claim 2,
wherein the control-block is configured to set the output-signal as one of at least three voltage levels based on the comparison-signal.

4. The circuit of claim 2,
wherein the first-reference-signal is periodic and comprises:
    a low-signal-portion with a bottom-level configured to demarcate signal levels below the low-value;
    a rising-signal-portion that rises from the bottom-level via a midpoint-level to a top-level;
    a high-signal-portion at the top-level, configured to demarcate signal levels above the high-value;
    a falling-signal-portion that falls from the top-level via the midpoint-level to the bottom-level; and
wherein the each of the second-reference-signal, the third-reference-signal and the fourth-reference-signal comprise different phase shifted representations of the first-reference-signal.

5. The circuit of claim 4, wherein:
the second-reference-signal is phase shifted by one quarter of the period of the first-reference-signal;
the third-reference-signal is phase shifted by one half of the period;
the fourth-reference-signal is phase shifted by three quarters of the period.

6. The circuit of claim 2,
wherein the first-reference-signal is periodic and comprises:
    a rising-signal-portion that rises from a bottom-level via a midpoint-level to a top-level;
    a falling-signal-portion that falls from the top-level via the midpoint-level to the bottom-level;
wherein:
    the fourth-reference signal is an inverted, or a phase shifted, representation of the first-reference-signal;
    the second-reference-signal is a low-signal-portion, representative of the low-value; and
    the third-reference-signal is a high-signal-portion, representative of the high-value.

7. The circuit of claim 4, wherein the output-signal is set:
to a ground-voltage-level if the comparator-input-signal crosses a rising-signal-portion below the midpoint-level;
to a middle-voltage-level, greater than the ground-voltage-level, if the comparator-input-voltage-signal crosses a falling-signal-portion below the midpoint-level;
to a boost-voltage-level, greater than the middle-voltage-level, if the comparator-input-voltage-signal crosses a falling-signal-portion above the midpoint-level; and
to the middle-voltage-level if the comparator-input-voltage-signal crosses a rising-signal-portion above the midpoint-level.

8. The circuit of claim 1,
wherein the input-control-circuit comprises a pulse-block configured to apply a pulse to the input-terminal if the comparator-input-voltage-signal is either greater than the high-value, or less than the low-value.

9. The circuit of claim 8,
wherein when the comparator-input-voltage-signal is greater than the high-value, the pulse is configured to be subtracted from the input-signal until the comparator-input-voltage-signal reaches the high-value.

10. The circuit of claim 8,
wherein when the comparator-input-voltage-signal is less than the low-value, the pulse is configured to be added to the input-signal until the comparator-input-voltage-signal reaches the low-value.

11. The circuit of claim 7,
further comprising an integrator coupled to the input-terminal and the output-terminal,
the integrator configured to generate the comparator-input-voltage-signal by integrating a difference between the input-signal and the output-signal.

12. The circuit of claim 11,
wherein the integrator comprises a reference-node coupled to a supply voltage that is half the middle-voltage-level.

13. The circuit of claim 1,
further comprising:
- a second-input-terminal configured to receive a second-input-signal; and
- a second-output-terminal configured to provide a second-output-signal, wherein:
- the comparator-block is configured to compare a second-comparator-input-voltage-signal representative of the second-input-signal received at the second-input-terminal with:
  - (i) the first-reference-signal,
  - (ii) the second-reference-signal,
  - (iii) the third-reference-signal and optionally
  - (iv) a fourth-reference-signal, in order to generate the comparison-signal;
- the control-block is configured to set the second-output-signal as one of at least two voltage levels based on the comparison-signal; and
- the input-control-circuit is configured to apply a second-feedback-control-signal to the second-input-terminal based on the comparison-signal.

14. The circuit of claim 13,
wherein the input-control-circuit comprises a common-current-pulse-block configured to apply a common-current-pulse to the input-terminal and the second-input-terminal if the comparator-input-voltage-signal is less than the low-value or if the second-comparator-input-voltage-signal is less than the low value.

15. The circuit of claim 13,
wherein the input-control-circuit comprises a single-ended-current-pulse-block configured to apply a single-ended-current-pulse to:
- the input-terminal, if the comparator-input-voltage-signal is greater than the high-value; or
- the second-feedback-input-terminal, if the second-comparator-input-voltage-signal is greater than the high-value.

\* \* \* \* \*